United States Patent
Sugawara

(10) Patent No.: US 8,865,529 B2
(45) Date of Patent: Oct. 21, 2014

(54) THIN-FILM TRANSISTOR DEVICE MANUFACTURING METHOD, THIN-FILM TRANSISTOR DEVICE, AND DISPLAY DEVICE

(75) Inventor: Yuta Sugawara, Osaka (JP)

(73) Assignee: Panasonic Corporation, Osaka (JP)

( * ) Notice: Subject to any disclaimer, the term of this patent is extended or adjusted under 35 U.S.C. 154(b) by 351 days.

(21) Appl. No.: 13/495,149

(22) Filed: Jun. 13, 2012

(65) Prior Publication Data

US 2013/0164892 A1 Jun. 27, 2013

Related U.S. Application Data

(63) Continuation of application No. PCT/JP2011/006196, filed on Nov. 7, 2011.

(51) Int. Cl.
| | |
|---|---|
| H01L 21/00 | (2006.01) |
| H01L 21/84 | (2006.01) |
| H01L 21/331 | (2006.01) |
| H01L 29/04 | (2006.01) |
| H01L 29/66 | (2006.01) |
| H01L 21/02 | (2006.01) |
| H01L 29/786 | (2006.01) |
| H01L 27/12 | (2006.01) |

(52) U.S. Cl.
CPC ............ *H01L 29/6675* (2013.01); *H01L 29/04* (2013.01); *H01L 21/02532* (2013.01); *H01L 29/78696* (2013.01); *H01L 27/1285* (2013.01); *H01L 27/1281* (2013.01); *H01L 21/02675* (2013.01)
USPC ........... 438/149; 438/150; 438/151; 438/166; 438/365; 438/487; 257/E21.134; 257/E21.271; 257/E21.413

(58) Field of Classification Search
None
See application file for complete search history.

(56) References Cited

U.S. PATENT DOCUMENTS

| | | | | |
|---|---|---|---|---|
| 7,629,208 | B2 * | 12/2009 | Arai et al. | 438/153 |
| 7,955,916 | B2 * | 6/2011 | Hayashi et al. | 438/166 |
| 8,168,518 | B2 | 5/2012 | Umezu et al. | |
| 2005/0112809 | A1 * | 5/2005 | Ryu et al. | 438/166 |
| 2010/0159619 | A1 | 6/2010 | Umezu et al. | |

FOREIGN PATENT DOCUMENTS

| | | |
|---|---|---|
| JP | 10-242052 | 9/1998 |
| JP | 2007-35964 | 2/2007 |
| JP | 2007-220918 | 8/2007 |
| JP | 2008-288425 | 11/2008 |
| JP | 2010-287645 | 12/2010 |
| JP | 2011-40587 | 2/2011 |

OTHER PUBLICATIONS

U.S. Appl. No. 13/455,375 to Yuta Sugawara, filed Apr. 25, 2012.
U.S. Appl. No. 13/453,158 to Yuta Sugawara, filed Apr. 23, 2012.
U.S. Appl. No. 13/338,816 to Yuta Sugawara, filed Dec. 28, 2011.

* cited by examiner

*Primary Examiner* — Mohsen Ahmadi
(74) *Attorney, Agent, or Firm* — Greenblum & Bernstein, P.L.C.

(57) ABSTRACT

A thin-film transistor device manufacturing method and others according to the present disclosure includes: forming a plurality of gate electrodes above a substrate; forming a gate insulating layer on the plurality of gate electrodes; forming an amorphous silicon layer on the gate insulating layer; forming a buffer layer and a light absorbing layer above the amorphous silicon layer; forming a crystalline silicon layer by crystallizing the amorphous silicon layer with heat generated by heating the light absorbing layer using a red or near infrared laser beam; and forming a source electrode and a drain electrode on the crystalline silicon layer in a region that corresponds to each of the plurality of gate electrodes, and film thicknesses of the gate insulating layer, the amorphous silicon layer, the buffer layer, and the light absorbing layer satisfy predetermined expressions.

10 Claims, 21 Drawing Sheets

FIG. 9

| X | 0.05 | 0.1 | 0.15 | 0.2 | 0.25 | 0.3 | 0.35 | 0.4 |
|---|---|---|---|---|---|---|---|---|
| λ = 808 nm | 21 | 43 | 64 | 85 | 106 | 128 | 149 | 170 |
| λ = 1064 nm | 27 | 53 | 80 | 106 | 133 | 160 | 186 | 213 |

(nm)

| Y | λ = 808 nm | λ = 1064 nm |
|---|---|---|
| 0.8 | 30 | 184 |
| 0.85 | 58 | 221 |
| 0.9 | 86 | 257 |
| 0.95 | 113 | 294 |
| 1 | 141 | 330 |
| 1.05 | 169 | 367 |
| 1.1 | 196 | 403 |

| SiO film | SiN film |
|---|---|
| 10 | 88 |
| 20 | 80 |
| 30 | 72 |
| 40 | 65 |
| 50 | 57 |
| 60 | 49 |
| 70 | 42 |
| 80 | 34 |
| 90 | 27 |
| 100 | 19 |
| 110 | 11 |
| 120 | 4 |

(nm)

Crystalline silicon region
having grain size of 50 nm

Crystalline silicon region having grain size of 50 nm

Crystalline silicon region having grain size smaller than 50 nm

THIN-FILM TRANSISTOR DEVICE MANUFACTURING METHOD, THIN-FILM TRANSISTOR DEVICE, AND DISPLAY DEVICE

CROSS-REFERENCE TO RELATED APPLICATION

This is a continuation application of PCT Patent Application No. PCT/JP2011/006196 filed on Nov. 7, 2011, designating the United States of America. The entire disclosures of the above-identified application, including the specification, drawings and claims are incorporated herein by reference in their entirety.

TECHNICAL FIELD

The present disclosure relates to a thin-film transistor device manufacturing method, a thin-film transistor device, and a display device.

BACKGROUND ART

For example, a thin-film transistor (TFT) is included in a liquid crystal panel or an organic EL panel. A channel portion of the thin-film transistor is made of amorphous silicon a-Si, or polycrystalline silicon poly-Si which is a crystalline material. A crystalline silicon layer (poly-Si layer) of the channel portion of the thin-film transistor is typically produced by forming an amorphous silicon layer (a-Si layer) and then irradiating the amorphous silicon layer with a laser beam of an excimer laser or the like so that the amorphous silicon layer is instantly increased in temperature and crystallized.

There are two types of thin-film transistor structures, namely, a bottom-gate structure in which a gate metal is located on a substrate side as seen from x-Si (x is a or poly) of the channel portion, and a top-gate structure in which a gate metal and a source-drain metal are located on a side opposite to the substrate side as seen from x-Si of the channel portion. The bottom-gate structure is mainly used for an a-Si TFT with a channel portion formed of an amorphous silicon layer, whereas the top-gate structure is mainly used for a poly-Si TFT with a channel portion formed of a crystalline silicon layer. The bottom-gate structure is commonly used as a structure of thin-film transistors in a liquid crystal panel or an organic EL panel used for a large-area display device.

There is also an instance where the poly-Si TFT has the bottom-gate structure, which provides an advantage of a reduced manufacturing cost. In the poly-Si TFT having the bottom-gate structure, the crystalline silicon layer is formed by irradiating an amorphous silicon layer with a laser beam to crystallize the amorphous silicon layer. In this method (laser annealing crystallization), the amorphous silicon layer is crystallized by heat generated by laser beam irradiation.

As a method of laser annealing, there is a method in which a silicon oxide layer is deposited as a buffer layer on the amorphous silicon layer, for example, and a light absorbing layer is deposited on the buffer layer, and the light absorbing layer is irradiated with a laser beam absorbed by the light absorbing layer and converted into heat so as to heat the amorphous silicon layer indirectly. This method is hereafter referred to as an indirect heating method with laser.

As the laser used for the indirect heating method with laser, a fixed laser in red or near infrared region capable of achieving high output and having output highly stable in time is effective. This is because, if the intensity of the laser beam changes in time, the temperature distribution is not uniform for crystals, resulting in non-uniform crystallinity in the crystalline silicon layer formed by the crystallization. With the excimer laser, it is difficult to form uniform crystals due to a problem such as difference in energy (change in time). Furthermore, the fixed laser is advantageous in terms of manufacturing in that the maintenance cost is reduced compared to the excimer laser which is a gas laser.

As the light absorbing layer used for the indirect heating method with laser, it is preferable to have optical characteristics with which absorptance for light having a wavelength in red and near-infrared region, more specifically, from 600 nm to 2000 nm is high. Furthermore, the light absorbing layer also has thermal characteristics, which makes it capable of going through a laser annealing crystallization process at a high temperature.

Examples of the light absorbing layer with the characteristics include Mo and Cr which are metals with high melting points. The metal films with high melting points generally have a large extinction coefficient k (greater than or equal to 2). Accordingly, with a film thickness (greater than or equal to 10 nm) that allows the metal films to be formed stably and going through the heating by the laser irradiation (greater than or equal to 1500 degrees), the transmittance of the metal film for the incident laser beam is less than or equal to 5%. Accordingly, the influence of multiple interference on the layered structure underneath can be ignored. Thus, regardless of the layered structure underneath, (for example, depending on the region in which the gate electrode is present and the region in which the gate electrode is not present), the absorptance of the light absorbing layer is constant.

Thin-film transistors in an organic EL panel are required to have particularly uniform characteristics. Accordingly, applying the aforementioned laser annealing crystallization to manufacturing of the thin-film transistor of the bottom-gate structure has the following drawback (problem). More specifically, in the thin-film transistor of the bottom-gate structure, first a gate electrode is formed using a metal material of higher heat conductivity than silicon or an insulation film, and then an insulation layer and an amorphous silicon layer are formed. Furthermore, after the light absorbing layer is formed on the amorphous silicon layer formed, the light absorbing layer which is the upper layer is irradiated with the laser beam, and the amorphous silicon layer is annealed so as to crystallize the amorphous silicon layer indirectly with the heat by the indirect heating method with laser. Upon the crystallization, there is a problem that the heat that was supposed to be used for crystallizing the amorphous silicon layer is absorbed by and propagated by the gate electrode, consequently causing lowered or non-uniform crystallinity due to insufficient crystallization of the amorphous silicon layer.

In view of such a problem, there is disclosed a method of disposing a dummy gate pattern in a nearby region of the gate electrode, i.e. a channel neighborhood, to reduce a difference in heat capacity between the amorphous silicon layer located above the gate electrode and the amorphous silicon layer located above the dummy gate pattern (for example, Patent Literature 1). There is also disclosed a method of extending the gate electrode to a laser beam scan upstream side so that, through the use of a pre-annealing effect of the extended portion of the gate electrode, the gate electrode is thermally saturated before laser beam reaches the light absorbing layer above the gate electrode of the thin-film transistor, thereby keeping the gate electrode from absorbing heat generated in the silicon thin film (for example, Patent Literature 2).

CITATION LIST

[Patent Literature 1] Japanese Unexamined Patent Application Publication No. 10-242052

[Patent Literature 2] Japanese Unexamined Patent Application Publication No. 2007-035964

SUMMARY OF INVENTION

Technical Problem

However, when applying the conventional method to the indirect heating method with laser, there is a problem caused by insufficient crystallization in the case where the amorphous silicon layer is crystallized by the indirection heating method with laser. The problems include degraded characteristics of manufactured thin-film transistors and non-uniform characteristics of individual transistors.

One non-limiting and exemplary embodiment has been conceived in view of the problem, and provides a thin-film transistor device manufacturing method capable of forming a crystalline silicon film with stable crystallinity using a laser in the red or near-infrared wavelength region, a thin-film transistor device, and a display device using the thin-film transistor device. Additional benefits and advantages of the disclosed embodiments will be apparent from the specification and Figures. The benefits and/or advantages may be individually provided by various embodiments and features of the specification and drawings disclosure, and need not all be provided in order to obtain one of more of the same.

Solution to Problem

In one general aspect, the techniques disclosed here feature of a thin-film transistor array device manufacturing method according to an aspect of the present disclosure including: preparing a substrate; forming a plurality of gate electrodes above the substrate; forming a gate insulating layer on the plurality of gate electrodes; forming an amorphous silicon layer on the gate insulating layer; forming a buffer layer on the amorphous silicon layer; forming a light absorbing layer on the buffer layer; forming a crystalline silicon layer by indirectly crystallizing the amorphous silicon layer with heat generated by heating the light absorbing layer using a laser beam emitted from a predetermined laser and having a wavelength greater than or equal to 600 nm while moving the predetermined laser in a given direction relative to the substrate; and forming a source electrode and a drain electrode on the crystalline silicon layer in a region that corresponds to each of the plurality of gate electrodes, wherein a film thickness of the gate insulating layer, a film thickness of the amorphous silicon layer, a film thickness of the buffer layer, and a film thickness of the light absorbing layer satisfy X and Y that are in a range defined by Expressions 1 to 4: Expression 1: $Y \leq -1.06X - 0.22\Delta A' + 1.07$; Expression 2: $Y \geq 1.29X + 1.61^*\Delta A' + 1.44$; Expression 3: $Y \geq 1.06X + 0.33\Delta A' + 0.89$; and Expression 4: $Y \leq 1.29X + -0.97^*\Delta A' - 0.95$, where X is a value obtained by dividing an optical film thickness of the light absorbing layer by the wavelength of the laser beam, the optical film thickness of the light absorbing layer being a result of multiplying the film thickness of the light absorbing layer by a refractive index of the light absorbing layer, Y is a value obtained by dividing a sum of an optical film thickness of the buffer layer, an optical thickness of the amorphous silicon layer, and an optical film thickness of the gate insulating layer by the wavelength of the laser beam, the optical film thickness of the buffer layer being a result of multiplying a thickness of the buffer layer by a refractive index of the buffer layer, the optical film thickness of the amorphous silicon layer being a result of multiplying a film thickness of the amorphous silicon layer by the refractive index of the amorphous silicon layer, and the optical film thickness of the gate insulating layer being a result of multiplying a film thickness of the gate insulating layer by a refractive index of the gate insulating layer, and $\Delta A'$ is a value calculated according to an expression $(AG/dG) \times (\rho \times c)/(\rho G \times cG)$, where $\rho$ and $c$ are a density and a specific heat of the light absorbing layer, respectively, dG, $\rho G$, and cG are a film thickness, a density, and a specific heat of the gate electrode, respectively, and AG is a maximum absorptance of the gate electrode when the light absorbing layer located above the gate electrode and the light absorbing layer not located above the gate electrode have an equal light absorptance for the laser beam.

Advantageous Effects of Invention

According to the present disclosure, the thin-film transistor device manufacturing method capable of forming the crystalline silicon film with stable crystallinity using the red or near-infrared laser, the thin film transistor, and the display apparatus using the thin-film transistor are implemented.

BRIEF DESCRIPTION OF DRAWINGS

These and other objects, advantages and features of the invention will become apparent from the following description thereof taken in conjunction with the accompanying drawings that illustrate a specific embodiment of the present invention. In the Drawings:

FIG. 9 is a diagram showing an example of a value obtained by converting a value in a horizontal axis in FIG. 8 to a film thickness of the light absorbing layer.

FIG. 12 is a diagram showing a set of thicknesses of a silicon oxide (SiO) film and a silicon nitride (SiN) film when the gate insulating layer in the thin-film transistor illustrated in FIG. 11 is made of the SiO film and the SiN film.

DETAILED DESCRIPTION (Underlying Knowledge of the Present Invention)

The inventors found out the following problems with regard to the thin film transistor device described in the "Background Art" section.

However, when applying the conventional method to the indirect heating method with laser, there is a problem as follows. In the methods disclosed in Patent Literatures 1 and 2, the electrode material is disposed near or in contact with the gate electrode, as a means of thermally saturating the gate electrode before laser beam reaches the silicon thin film located above the gate electrode. Hence, there is a problem that it is difficult to densely arrange gate electrode patterns in the case of manufacturing a higher-resolution display device using thin-film transistors of the bottom-gate structure. Furthermore, the method disclosed in Patent Literature 2 has a constraint that thin-film transistors need to be arranged so that a channel direction of the thin-film transistors is constantly in parallel with a scan direction. This poses a serious problem in the case of manufacturing a higher-resolution display device, because design flexibility of circuit patterns in pixels of the display device is significantly reduced.

Figure 1:
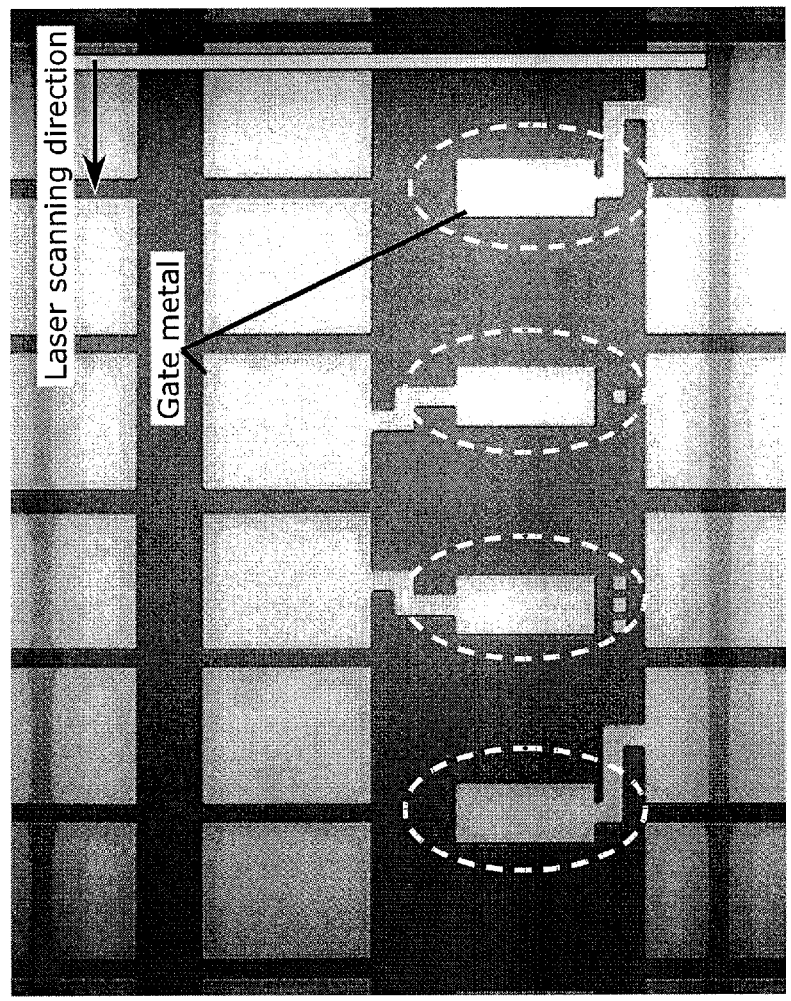
FIG. 1 is a diagram showing non-uniform crystallinity in the case where laser annealing crystallization is performed by scanning with a solid-state laser in the visible region.
Figure 1:
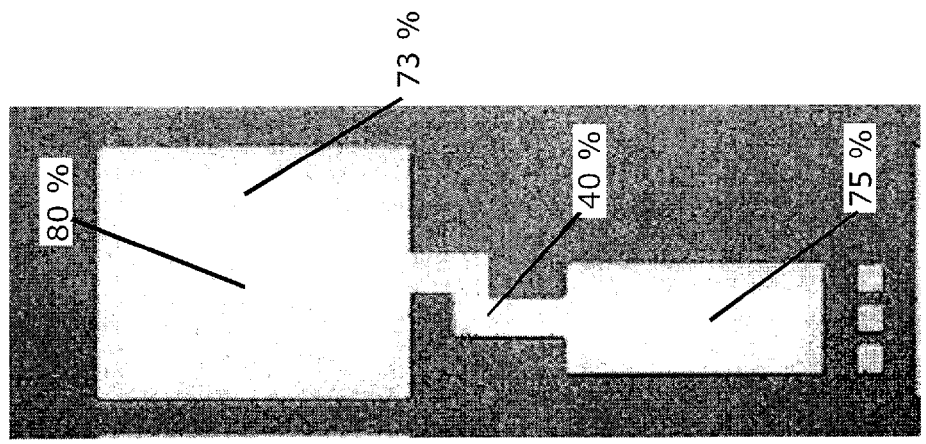

Furthermore, when crystallizing the amorphous silicon layer indirectly using the heat on the light absorbing layer as described above, that is, when the light absorbing layer is irradiated and scanned with a laser beam in the continuous wave mode (or the quasi-continuous wave mode) in the red (or near-infrared) wavelength region, a problem different from the case in which the scanning using the excimer laser is performed arises. More specifically, when performing the crystallization, a heat diffusion length in the amorphous silicon layer becomes longer, which increases an influence of heat conduction by the gate electrode; resulting in insufficient crystallization. This is described below, with reference to FIG. 1. FIG. 1 is a diagram showing non-uniform crystallinity in the case where laser annealing crystallization is performed by scanning with the solid-state laser in the visible region.

As shown in the right part of FIG. 1, non-uniform crystallinity occurs on a scan upstream side (right in the drawing). The left part of FIG. 1 shows a crystallization rate of amorphous silicon above one of a plurality of gate metals shown in the right part of FIG. 1. In the left part of FIG. 1, for example, a crystallization rate of 80% indicates crystalline silicon of 30 nm to 40 nm in grain size, while a crystallization rate of 40% indicates crystalline silicon of 10 nm to 20 nm in grain size. Non-uniform crystallinity occurs in the case where crystallization is insufficient (not uniform), as shown in the left part of FIG. 1.

Thus, crystallization is insufficient in the case where the amorphous silicon layer is crystallized by the indirection heating method with laser. This causes problems such as degraded characteristics of manufactured thin-film transistors and non-uniform characteristics of individual transistors.

One non-limiting and exemplary embodiment has been conceived in view of the problems, and provides a thin-film transistor device manufacturing method capable of forming a crystalline silicon film with stable crystallinity using a laser in the red or near-infrared wavelength region, a thin-film transistor device, and a display device using the thin-film transistor device.

The thin-film transistor device manufacturing method according to a first aspect includes: preparing a substrate; forming a plurality of gate electrodes above the substrate; forming a gate insulating layer on the plurality of gate electrodes; forming an amorphous silicon layer on the gate insulating layer; forming a buffer layer on the amorphous silicon layer; forming a light absorbing layer on the buffer layer; forming a crystalline silicon layer by indirectly crystallizing the amorphous silicon layer with heat generated by heating the light absorbing layer using a laser beam emitted from a predetermined laser and having a wavelength greater than or equal to 600 nm while moving the predetermined laser in a given direction relative to the substrate; and forming a source electrode and a drain electrode on the crystalline silicon layer in a region that corresponds to each of the plurality of gate electrodes, wherein a film thickness of the gate insulating layer, a film thickness of the amorphous silicon layer, a film thickness of the buffer layer, and a film thickness of the light absorbing layer satisfy X and Y that are in a range defined by Expressions 1 to 4: Expression 1: $Y \leq -1.06X - 0.22\Delta A' + 1.07$; Expression 2: $Y \geq 1.29X + 1.61 * \Delta A' + 1.44$; Expression 3: $Y \geq 1.06X + 0.33\Delta A' + 0.89$; and Expression 4: $Y \leq 1.29X + -0.97 * \Delta A' - 0.95$, where X is a value obtained by dividing an optical film thickness of the light absorbing layer by the wavelength of the laser beam, the optical film thickness of the light absorbing layer being a result of multiplying the film thickness of the light absorbing layer by a refractive index of the light absorbing layer, Y is a value obtained by dividing a sum of an optical film thickness of the buffer layer, an optical thickness of the amorphous silicon layer, and an optical film thickness of the gate insulating layer by the wavelength of the laser beam, the optical film thickness of the buffer layer being a result of multiplying a thickness of the buffer layer by a refractive index of the buffer layer, the optical film thickness of the amorphous silicon layer being a result of multiplying a film thickness of the amorphous silicon layer by the refractive index of the amorphous silicon layer, and the optical film thickness of the gate insulating layer being a result of multiplying a film thickness of the gate insulating layer by a refractive index of the gate insulating layer, and $\Delta A'$ is a value calculated according to an expression $(AG/dG) \times (\rho \times c)/(\rho G \times cG)$, where $\rho$ and c are a density and a specific heat of the light absorbing layer, respectively, dG, $\rho G$, and cG are a film thickness, a density, and a specific heat of the gate electrode, respectively, and AG is a maximum absorptance of the gate electrode when the light absorbing layer located above the gate electrode and the light absorbing layer not located above the gate electrode have an equal light absorptance for the laser beam.

According to this aspect, the film thicknesses of the gate insulating film, the amorphous silicon layer that serves as the channel layer, the buffer layer, and the light absorbing layer having a predetermined optical characteristics to a laser beam in the red or near infrared wavelength region satisfy the aforementioned condition, so that (1) the light absorbing layer not located above the gate electrode (hereafter referred to as a second region) has a higher light absorptance than the light absorbing layer located above the gate electrode (hereafter referred to as a first region), and also (2) the silicon layer located above the gate electrode has a higher heat generation temperature than a melting point of the amorphous silicon layer.

Owing to the advantageous effect (1), the amorphous silicon layer in the second region generates more heat than the amorphous silicon layer in the first region, due to the heat from the light absorbing layer. Hence, heat generated in the light absorbing layer in the second region is transmitted to the gate electrode before the laser beam emitted from the predetermined laser reaches a starting end of the light absorbing layer in the first region at which the irradiation with the laser beam starts, thereby thermally saturating the gate electrode.

As a result, from the starting end of the gate electrode at which the irradiation with the laser beam starts to a terminating end of the gate electrode at which the irradiation with the laser beam terminates in the gate electrode, a rate at which heat generated in the light absorbing layer in the first region is absorbed by the gate electrode can be reduced. This allows the amorphous silicon layer in the first region to have a substantially uniform heat generation temperature distribution. Thus, a substantially uniform crystal structure can be obtained in the crystalline silicon layer produced by crystallizing the amorphous silicon layer.

Moreover, owing to the advantageous effect (2), even in the case where the light absorbing layer in the second region has an excessively higher light absorptance than the light absorbing layer in the first region, that is, even in the case where the light absorbing layer in the second region generates excessively more heat than the light absorbing layer in the first region, the amorphous silicon in the first region and the second region melts to become molten silicon, as a result of which a heat conductivity of the amorphous silicon layer increases to a substantially same level as a heat conductivity of metal typically used as a gate electrode.

Accordingly, heat generated in the molten silicon layer in the second region is transmitted to the molten silicon layer in the first region, rather than being transmitted to the gate electrode via the gate insulating layer. Since heat generated in the molten silicon layer in the second region is kept from being excessively transmitted to the gate electrode, there is no deterioration in heat generation temperature distribution of the gate electrode. Therefore, a decrease in uniformity of the heat generation temperature distribution of the amorphous silicon layer in the first region caused by the deterioration of the heat generation temperature distribution of the gate electrode can be prevented.

Thus, the combination of the advantageous effects (1) and (2) ensures a uniform crystal structure in the crystalline silicon layer produced by crystallizing the amorphous silicon layer. This makes it possible to realize a thin-film transistor device in which, from the crystalline silicon layer corresponding to the starting end of the gate electrode at which the irradiation with the laser beam starts to the crystalline silicon layer corresponding to the terminating end of the gate electrode at which the irradiation with the laser beam terminates in the gate electrode, a variation in crystallization rate in the crystalline silicon layer is suppressed.

In the thin-film transistor device manufacturing method according to a second aspect, the light absorbing layer is translucent to a predetermined wavelength range of the laser beam, where an extinction coefficient k<1.

The thin-film transistor device manufacturing method according to a third aspect includes removing at least the light absorbing layer after forming the crystalline silicon layer and before forming the source electrode and the drain electrode.

The thin-film transistor device manufacturing method according to a fourth aspect includes removing the buffer layer and the light absorbing layer after forming the crystalline silicon layer and before forming the source electrode and the drain electrode.

In the thin-film transistor device manufacturing method according to a fifth aspect, when forming the light absorbing layer, the predetermined laser emits the laser beam in an oscillation mode that is a continuous wave mode or a quasi-continuous wave mode.

In the thin-film transistor device manufacturing method according to a sixth aspect, the predetermined laser is included in a solid-state laser device.

In the thin-film transistor device manufacturing method according to a seventh aspect, the predetermined laser is included in a laser device that uses a semiconductor laser element.

In the thin-film transistor device manufacturing method according to an eighth aspect, when forming the light absorbing layer, a variation in irradiation energy density of the laser beam on the amorphous silicon layer is approximately less than 5%.

In the thin-film transistor device manufacturing method according to a ninth aspect, the wavelength of the predetermined laser has a wavelength from 600 nm to 2000 nm.

The thin-film transistor device manufacturing method according to a tenth aspect includes the gate electrode forming includes: forming an undercoat layer made of silicon oxide on the substrate; and forming the plurality of gate electrodes on the undercoat layer.

The thin-film transistor according to an eleventh aspect includes: a substrate; a plurality of gate electrodes formed above the substrate; a gate insulating layer formed on the plurality of gate electrodes; a crystalline silicon layer formed on the gate insulating layer; a source electrode and a drain electrode formed on the crystalline silicon layer in a region that corresponds to each of the plurality of gate electrodes, the crystalline silicon layer is formed by forming a buffer layer on the amorphous silicon layer and forming a light absorbing layer on the buffer layer, after the amorphous silicon layer is formed on the gate insulating layer, and indirectly crystallizing the amorphous silicon layer with heat generated by heating the light absorbing layer using a laser beam emitted from a predetermined laser and having a wavelength greater than or equal to 600 nm while moving the predetermined laser in a given direction relative to the substrate; and in which a film thickness of the gate insulating layer, a film thickness of the amorphous silicon layer, a film thickness of the buffer layer, and a film thickness of the light absorbing layer satisfy X and Y that are in a range defined by Expressions 1 to 4: Expression 1: $Y \leq -1.06X - 0.22\Delta A' + 1.07$; Expression 2: $Y \geq 1.29X + 1.61*\Delta A' + 1.44$; Expression 3: $Y \geq 1.06X + 0.33\Delta A' + 0.89$; and Expression 4: $Y \leq 1.29X + -0.97*\Delta A' - 0.95$, where X is a value obtained by dividing an optical film thickness of the light absorbing layer by the wavelength of the laser beam, the optical film thickness of the light absorbing layer being a result of multiplying the film thickness of the light absorbing layer by a refractive index of the light absorbing layer, Y is a value obtained by dividing a sum of an optical film thickness of the buffer layer, an optical thickness of the amorphous silicon layer, and an optical film thickness of the gate insulating layer by the wavelength of the laser beam, the optical film thickness of the buffer layer being a result of multiplying a thickness of the buffer layer by a refractive index of the buffer layer, the optical film thickness of the amorphous silicon layer being a result of multiplying a film thickness of the amorphous silicon layer by the refractive index of the amorphous silicon layer, and the optical film thickness of the gate insulating layer being a result of multiplying a film thickness of the gate insulating layer by a refractive index of the gate insulating layer, and $\Delta A'$ is a value calculated according to an expression $(AG/dG) \times (\rho \times c)/(\rho G \times cG)$, where $\rho$ and c are a density and a specific heat of the light absorbing layer, respectively, dG, $\rho G$, and cG are a film thickness, a density, and a specific heat of the gate electrode, respectively, and AG is a maximum absorptance of the gate electrode when the light absorbing layer located above the gate electrode and the light absorbing layer not located above the gate electrode have an equal light absorptance for the laser beam.

The display apparatus according to a twelfth aspect is a display device including a liquid crystal panel or an EL panel, including the thin-film transistor device according to the eleventh aspect, and the thin-film transistor device drives the liquid crystal panel or the EL panel.

In the display apparatus according to a thirteenth aspect, the EL panel is an organic EL panel.

The thin-film transistor device manufacturing method according to a fourteenth aspect includes preparing a substrate; forming a plurality of gate electrodes above the substrate; forming a gate insulating layer on the plurality of gate electrodes; forming an amorphous silicon layer on the gate insulating layer; forming a buffer layer on the amorphous silicon layer; forming a light absorbing layer on the buffer layer; forming a crystalline silicon layer by indirectly crystallizing the amorphous silicon layer with a heat generated by heating the light absorbing layer using a laser beam emitted from a predetermined laser and having a wavelength greater than or equal to 600 nm while moving the predetermined laser in a given direction relative to the substrate; and forming a source electrode and a drain electrode on the crystalline silicon layer in a region that corresponds to each of the plurality of gate electrodes, wherein, when forming the gate electrodes, the gate insulating layer, the amorphous silicon layer, the buffer layer, and the light absorbing layer, process is performed so that, in the crystalline silicon layer forming, when the light absorbing layer is irradiated with the laser beam, a maximum reached temperature of the light absorbing layer in a region not located above the gate electrode is higher than a maximum reached temperature of the light absorbing layer in a region located above the gate electrode and also the light absorbing layer in the region located above the gate electrode has a substantially uniform maximum reached temperature, the region not located above the gate electrode being upstream in the direction of the relative movement of the predetermined laser.

In the thin-film transistor device manufacturing method according to a fifteenth aspect, the gate insulating layer, the amorphous silicon layer, the buffer layer, and the light absorbing layer are formed with respective film thicknesses so that, in the crystalline silicon layer forming, when the light absorbing layer is irradiated with the laser beam, the maximum reached temperature of the light absorbing layer in the region not located above the gate electrode is higher than the maximum reached temperature of the light absorbing layer in the region located above the gate electrode and also the light absorbing layer in the region located above the gate electrode has the substantially uniform maximum reached temperature, the region not located above the gate electrode being upstream in the direction of the relative movement of the predetermined laser.

The thin-film transistor device manufacturing method according to a sixteenth aspect includes: preparing a substrate; forming a gate electrode above the substrate; forming a gate insulating layer on the gate electrode; forming a semiconductor material layer including a semiconductor material on the gate insulating layer; forming a buffer layer on the semiconductor material layer; forming a light absorbing layer having a predetermined optical constant on the buffer layer; forming a crystalline silicon layer by indirectly crystallizing the amorphous silicon layer with a heat generated by heating the light absorbing layer using a laser beam emitted from a predetermined laser and having a wavelength from 600 nm to 2000 nm while moving the predetermined laser in a given direction relative to the substrate; and forming a source electrode and a drain electrode on the crystalline silicon layer in a second region that does not correspond to each of the plurality of gate electrodes and different from a first region corresponding to the plurality of gate electrodes, wherein the gate insulating layer, the semiconductor material layer, the buffer layer, and the light absorbing layer are formed such that a heating value of the light absorbing layer in the second region per unit volume is higher than a heating value of the light absorbing layer in the first region per unit volume, and when forming the crystalline silicon layer, heat generated in the light absorbing layer in the first region by the irradiation with the predetermined laser beam and transmitted to and absorbed by the gate electrode is accumulated in the gate electrode without being diffused into the semiconductor material layer in the second region, and a part having a uniform temperature distribution is formed in the light absorbing layer in the first region generating the heat, to crystallize the semiconductor material layer.

In the thin-film transistor device manufacturing method according to a seventeenth aspect, the gate insulating layer, the amorphous silicon layer, the buffer layer, and the light absorbing layer are formed with respective film thicknesses so that the heating value of the light absorbing layer in the second region per unit volume is higher than the heating value of the light absorbing layer in the first region per unit volume.

In the thin-film transistor device manufacturing method according to an eighteenth aspect, the second region of the light absorbing layer is a region upstream and downstream of the first region of the semiconductor material layer, in a direction in which the predetermined laser beam is moved relative to the substrate in the crystalline silicon layer forming.

In the thin-film transistor device manufacturing method according to a nineteenth aspect, when forming the gate insulating layer, the semiconductor material layer, the buffer layer, and the light absorbing layer, process is performed so that, when forming the crystalline silicon layer, a difference between the heating value of the semiconductor material layer in the second region per unit volume and the heating value of the semiconductor material layer in the first region per unit volume is equal to or more than a heating value of the gate electrode per unit volume.

In the thin-film transistor device manufacturing method according to a twentieth aspect, when forming the gate insulating layer, the semiconductor material layer, the buffer layer, and the light absorbing layer, process is performed so that, when forming the crystalline silicon layer, the part having the uniform temperature distribution is formed in the light absorbing layer in the first region at a ratio of 0.8 to 1.0 in size to the first region.

According to the aspects described above, the thin-film transistor device manufacturing method capable of forming the crystalline silicon film with stable crystallinity using the red or near-infrared laser, the thin film transistor, and the display apparatus using the thin-film transistor are implemented. More specifically, the thin-film transistor device manufacturing method capable of forming the crystalline silicon layer with stable crystallinity using the indirect heating method with laser using the red and near-infrared laser without particularly changing the structure of the thin-film transistor such as the patterned shape of the gate electrode, by forming the silicon thin-film, the gate insulating layer, the buffer layer, and the light absorbing layer having the predetermined optical characteristics to the laser beam in the red and near-infrared wavelength region such that the thicknesses of the layers satisfy the predetermined conditions, the thin-film transistor device, and the display apparatus using the thin-film transistor device can be implemented.

The following describes an embodiment of the present disclosure with reference to drawings.

Figure 2:
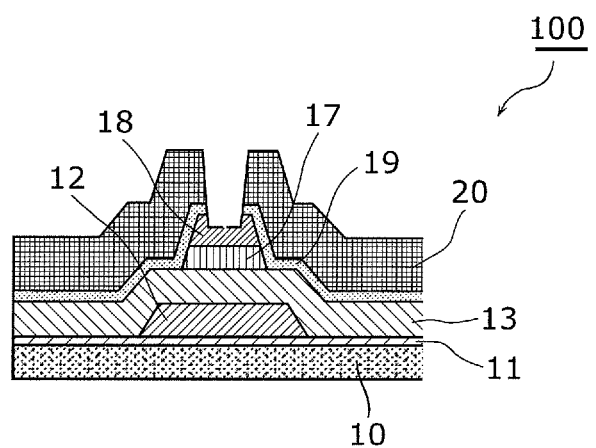
FIG. 2 is a cross-section diagram showing a structure of a thin-film transistor included in a display device in an embodiment of the present disclosure.

FIG. 2 is a cross-section diagram showing a structure of a thin-film transistor included in an organic light-emitting display device in the embodiment of the present disclosure.

A thin-film transistor 100 shown in FIG. 2 is a thin-film transistor of the bottom-gate structure, and includes a substrate 10, an undercoat layer 11, a gate electrode 12, a gate insulating layer 13, a crystalline silicon layer 17, an amorphous silicon layer 18, an n+ silicon layer 19, and source-drain electrodes 20.

The substrate 10 is an insulation substrate made of, for example, transparent glass or quartz.

The undercoat layer 11 is formed on the substrate 10, and made of, for example, a silicon nitride ($SiN_x$) layer, a silicon oxide ($SiO_x$) layer, or a stacked structure of a silicon nitride layer and a silicon oxide layer. It is preferable that the undercoat layer 11 is made of silicon oxide ($SiO_x$) where $1.5<x<2.0$, with a film thickness of 300 nm to 1500 nm. A more preferable film thickness range of the undercoat layer 11 is 500 nm to 1000 nm. When the undercoat layer 11 is thick, a heat load on the substrate 10 can be reduced. When the undercoat layer 11 is excessively thick, however, film peeling or cracks occur.

The gate electrode 12 is formed on the undercoat layer 11, and typically made of a metal material such as molybdenum (Mo) or a Mo alloy (e.g. MoW (molybdenum-tungsten alloy)). The gate electrode 12 is made of any metal capable of withstanding a melting point of silicon. Accordingly, the gate electrode 12 may be made of an alloy of W (tungsten), Ta (tantalum), Nb (niobium), Ni (Nickel), Cr (chromium), Mo, and the like. The gate electrode 12 preferably has a film thickness of 30 nm to 300 nm, and more preferably has a film thickness of 50 nm to 100 nm. When the gate electrode 12 is thin, a transmittance of the gate electrode 12 increases, which tends to induce a decrease in reflection of laser beam described later. When the gate electrode 12 is thick, on the other hand, the gate insulating layer 13 described later has a poorer coverage, which tends to induce degradation in characteristics of the thin-film transistor 100. In particular, a break in the gate insulating film at a step portion at an end of the gate electrode 12 causes the gate electrode 12 and the n+ silicon layer 17 to be electrically conducted.

The gate insulating layer 13 is formed so as to cover the gate electrode 12, and made of, for example, the single-layer structure of a silicon oxide layer or a silicon nitride layer, or a stacked structure of a silicon oxide layer and a silicon nitride layer. That is, there are appropriate ranges of the film thickness of the gate insulating layer 13 in the case of forming the crystalline silicon layer 17 by the indirect heating method with laser for the single-layer structure and the multi-layer structure. This appropriate range is defined by predetermined relational expressions. The predetermined relational expressions will be described in detail later.

The crystalline silicon layer 17 is formed on the gate insulating layer 13, and made of a polycrystalline silicon layer (poly-Si layer). Note that, the crystalline silicon layer 17 is formed as follows. More specifically, first, after forming an amorphous silicon layer 14 (not illustrated) made of a-Si on the gate insulating layer 13, and a buffer layer 15 made of a silicon oxide film is deposited on the amorphous silicon layer 14, for example. Furthermore, after depositing a light absorbing layer 16 (for example, a diamond-like carbon film) which absorbs the laser beam and generates heat on the buffer layer 15, the light absorbing layer is irradiated with the laser beam so as to heat the light absorbing layer. As described above, with the heat from the light absorbing layer, the amorphous silicon layer 14 is indirectly heated, and the crystalline silicon layer 17 is formed by turning the amorphous silicon layer 14 into poly-crystals (including micro-crystals).

Polycrystalline mentioned here has a broad meaning that includes not only a polycrystalline structure which is narrowly interpreted as being made up of crystals of 50 nm or more, but also a microcrystalline structure which is narrowly interpreted as being made up of crystals of 50 nm or less. The broad meaning of polycrystalline is hereafter adopted.

A laser light source used for laser irradiation is a laser of a wavelength in the red or near infrared region in a visible light region. The laser having a wavelength in the red or near-infrared region is a laser having a wavelength from 600 nm to 2000 nm, and is preferably a laser having a wavelength from 800 nm to 1100 nm.

The laser of the wavelength region in red or near infrared region may be in an oscillation mode that is a continuous wave mode or a quasi-continuous wave mode. In the case where the laser has a pulse oscillation mode other than the continuous wave mode or the quasi-continuous wave mode, the light absorbing layer 16 is discontinuously irradiated with laser beam in time, making it impossible to constantly maintain the light absorbing layer 16 heated in time. Consequently, the molten state of the amorphous silicon layer 14 is not maintained constantly. Here, the quasi-continuous wave mode is included because the molten state can be maintained by applying a pulse to the light absorbing layer 16 for reheating before the amorphous silicon layer 14 is cooled to its melting point or below. That is, the quasi-continuous wave mode is preferably used in such a manner that a pulse is applied to the light absorbing layer 16 for reheating before the amorphous silicon layer 14 is cooled to its melting point or below, thereby maintaining the high-temperature state of the amorphous silicon layer 14. Alternatively, the laser having a wavelength in the red or near-infrared region may be a solid-state laser device, and may be a laser device using a semiconductor laser element. Any of these devices is preferable because the laser beam can be controlled accurately. It is also preferable that a variation in irradiation energy density of the laser of the wavelength in red or near-infrared region on the light absorbing layer 16 is approximately less than 5%, in order to form the crystalline silicon layer 17 of uniform crystallinity. By forming the crystalline silicon layer 17 of uniform crystallinity, original design characteristics of the thin-film transistor can be attained, and also uniform characteristics can be achieved.

The amorphous silicon layer 18 is formed on the crystalline silicon layer 17. Note that, the thin-film transistor 100 includes a channel layer in which the amorphous silicon layer 18 is stacked on the crystalline silicon layer 17 as described above.

The n+ silicon layer 19 is formed so as to cover the gate insulating layer 13 and side surfaces of the amorphous silicon layer 18 and the crystalline silicon layer 17.

The source-drain electrodes 20 are formed on the n+ silicon layer 19, and made of, for example, a metal material including: metal such as Mo or an Mo alloy; metal such as titanium (Ti) or aluminum (Al), or an Al alloy; metal such as copper (Cu) or a Cu alloy; or metal such as silver (Ag), chromium (Cr), tantalum (Ta), tungsten (W), or the like.

The thin-film transistor 100 has the structure described above.

Figure 3:
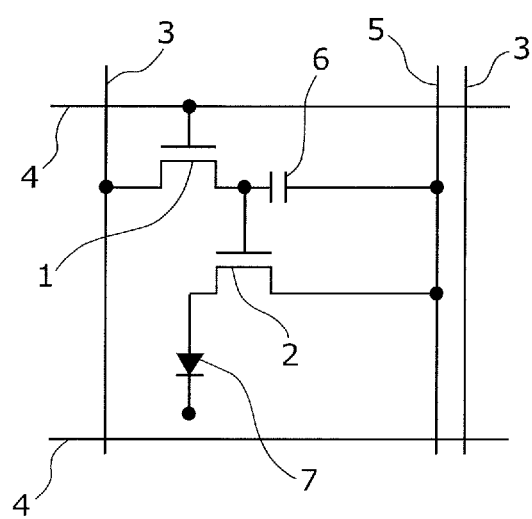
FIG. 3 is a diagram showing an equivalent circuit of the display device in the embodiment of the present disclosure.

FIG. 3 is a diagram showing an equivalent circuit of the display device in the embodiment of the present disclosure.

The organic light-emitting display device shown in FIG. 3 includes a switching transistor 1, a drive transistor 2, a data line 3, a scan line 4, a current supply line 5, a capacitor 6, and an organic EL element 7.

The switching transistor 1 is connected to the data line 3, the scan line 4, and the capacitor 6.

The drive transistor 2 corresponds to, for example, the thin-film transistor 100 shown in FIG. 2, and is connected to the current supply line 5, the capacitor 6, and the organic EL element 7.

The data line 3 is a line through which data (a magnitude of a voltage) for determining brightness of a pixel of the organic EL element 7 is transmitted to the pixel of the organic EL element 7.

The scan line 4 is a line through which data for determining switching (ON/OFF) of the pixel of the organic EL element 7 is transmitted to the pixel of the organic EL element 7.

The current supply line 5 is a line for supplying a large current to the drive transistor 2.

The capacitor 6 holds a voltage value (charge) for a fixed time.

The organic light-emitting display device has the structure described above.

The following describes a manufacturing method of the aforementioned thin-film transistor 100.

Figure 4:
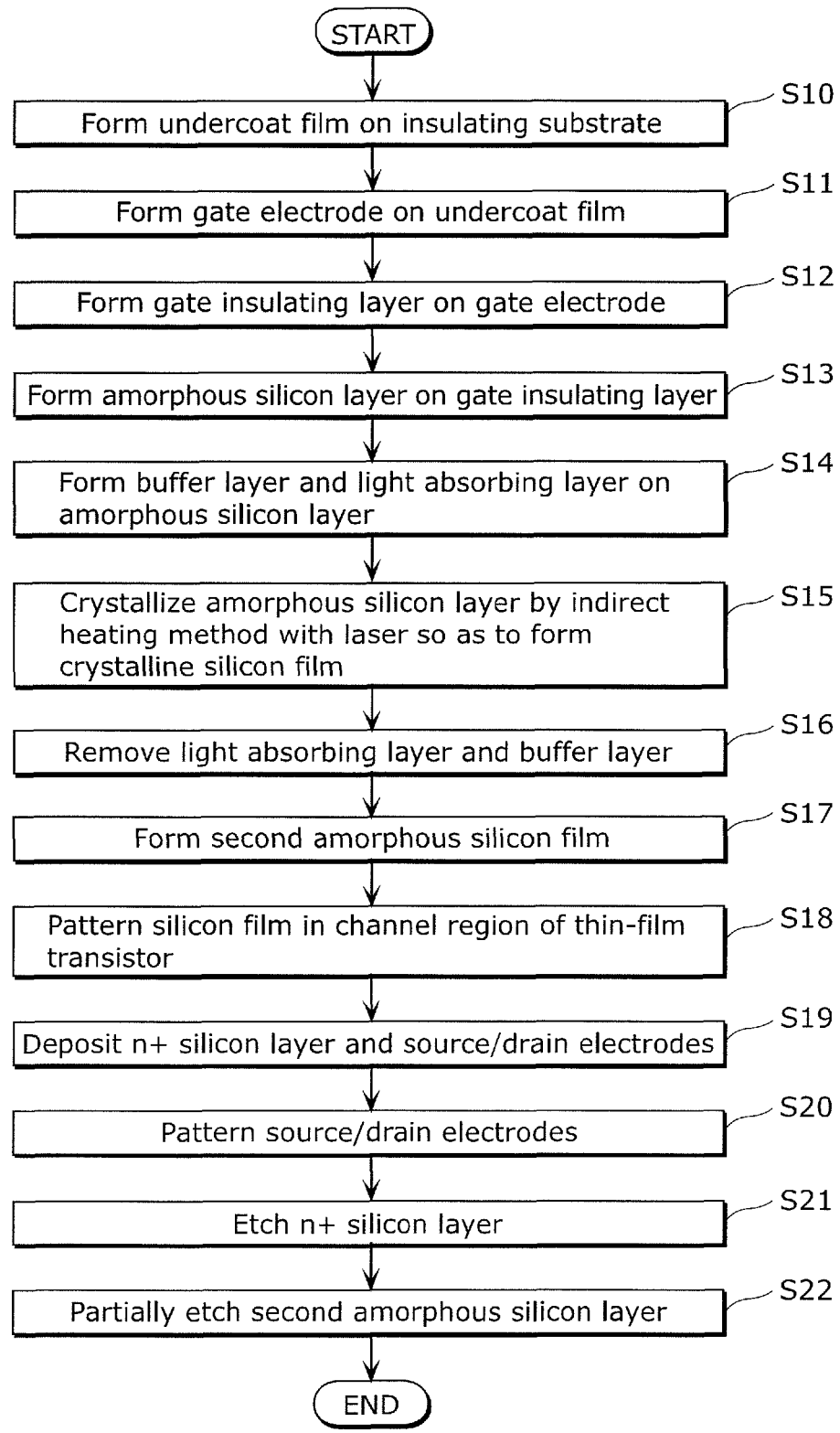
FIG. 4 is a flowchart showing a manufacturing process of the thin-film transistor in the display device in the embodiment of the present disclosure.
Figure 5A:
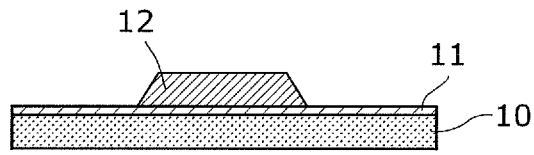
FIG. 5A is a cross-section diagram for describing a manufacturing method of the thin-film transistor in the display device in the embodiment of the present disclosure.

FIG. 4 is a flowchart showing a manufacturing process of the thin-film transistor in the organic light-emitting display device in the embodiment of the present disclosure. Though a plurality of thin-film transistors 100 are manufactured at the same time, the following describes a method of manufacturing one thin-film transistor for simplicity's sake. FIGS. 5A to 5L are diagrams for describing the manufacturing method of the thin-film transistor in the organic light-emitting display device in the embodiment of the present disclosure. FIG. 6 is a diagram schematically showing the indirect heating method with laser in S15 in FIG. 4.

First, the substrate 10 is prepared, and the undercoat layer 11 is formed on the substrate 10 (Step S10). Next, the gate electrode 12 is formed on the undercoat layer 11 (Step S11).

In detail, the undercoat layer 11 is deposited on the substrate 10 by plasma CVD (Chemical Vapor Deposition). Following this, a metal film for the gate electrode 12 is deposited by sputtering, and photolithography and etching are performed to form the gate electrode 12 in the thin-film transistor 100 (FIG. 5A). Here, the gate electrode 12 is typically made of a metal material such as Mo or an Mo alloy (e.g. MoW (molybdenum-tungsten alloy)).

Next, the gate insulating layer 13 is formed on the gate electrode 12 (Step S12). After this, the amorphous silicon layer 14 is formed on the gate insulating layer 13 (Step S13).

Figure 5B:
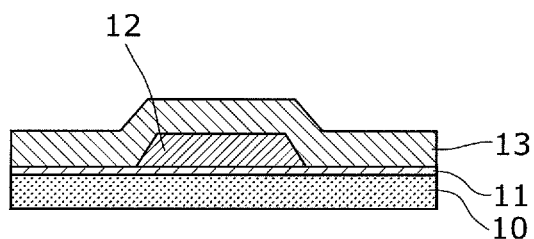
FIG. 5B is a cross-section diagram for describing the manufacturing method of the thin-film transistor in the display device in the embodiment of the present disclosure.
Figure 5C:
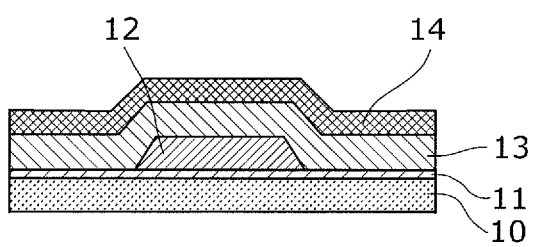
FIG. 5C is a cross-section diagram for describing the manufacturing method of the thin-film transistor in the display device in the embodiment of the present disclosure.
Figure 6:
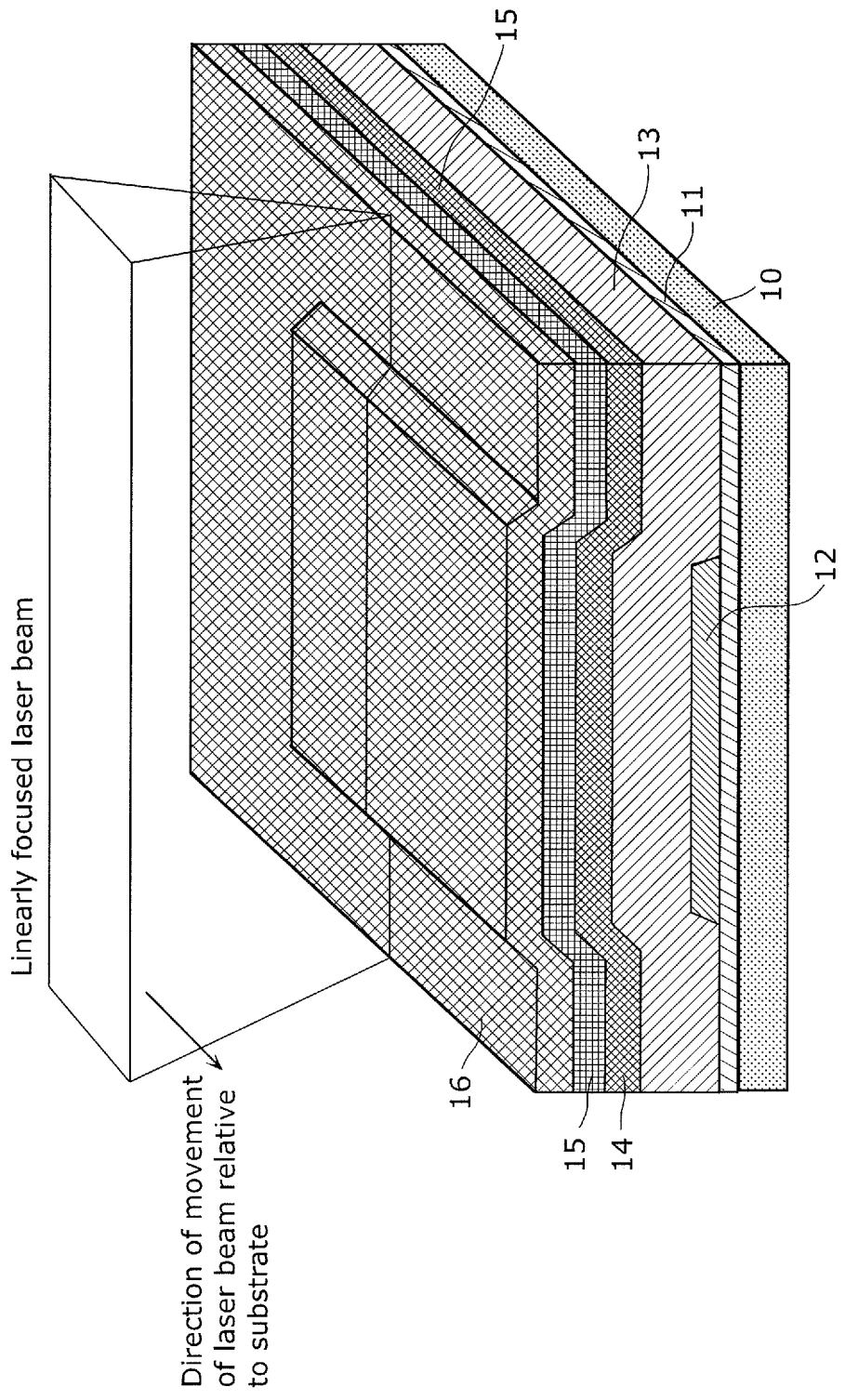
FIG. 6 is a diagram schematically showing the indirect heating method with laser in Step S15 in FIG. 4.

In detail, by the plasma CVD, the gate insulating layer 13 is formed on the gate electrode 12 so as to cover the undercoat layer 11 and the gate electrode 12 (FIG. 5B). The amorphous silicon layer 14 is continuously deposited on the deposited gate insulating layer 13 (FIG. 5C).

Next, the buffer layer 15 is deposited on the amorphous silicon layer 14, and the light absorbing layer 16 is deposited on the deposited buffer layer 15 (S14).

Here, it is preferable that the buffer layer 15 is made of a material which does not react with silicon even in a temperature region (greater than or equal to 1400 degrees) in which the amorphous silicon layer 14 is annealed and crystallized. Such materials include silicon oxide, silicon nitride, and others, for example. The buffer layer 15 is deposited continuously after depositing the gate insulating layer 13 and the amorphous silicon layer 14 by the plasma CVD, without exposing a deposition chamber to the air, for example. The thickness of the buffer layer 15 is, for example, from 5 nm to 500 nm, and is preferably from 30 nm to 400 nm. This is because, there is less control if the thickness is less than or equal to 5 nm, which is inconvenient at the time of manufacturing. If the thickness is greater than or equal to 500 nm, the heat from the light absorbing layer heated by the laser irradiation is not transmitted well, requiring excessive optical energy for crystallizing the amorphous silicon layer.

Furthermore, the light absorbing layer 16 has the predetermined optical characteristics, and is formed to be translucent (Extinction coefficient k<1) to the laser beam having a wavelength in the red or near-infrared region. The light absorbing layer 16 is deposited by the vapor deposition or the sputtering. For example, when the sputtering is performed, carbon is used as a target, and Ar or the like is used as the gas for sputtering. The thickness of the buffer layer 16 is, for example, from 10 nm to 500 nm, and is preferably from 20 nm to 200 nm. This is because, with the thickness of 10 nm, the laser beam is transmitted at high rate, lowering the energy absorbed by the light absorbing layer. Consequently, the heat generated at the light absorbing layer is insufficient. With the thickness of 500 nm, the probability of crack increases due to increased stress on the film. Ablation is likely to occur when irradiating the light absorbing layer having cracks with laser beam, making the light absorbing layer not suitable for the indirect heating process with laser.

The light absorbing layer 16 has the predetermined optical characteristics. Thus, a certain ratio of the incident laser beam is transmitted to the laser underneath, causing the multiple interference in the film below. Consequently, the absorptance of the light absorbing layer 16 is different in a region in which the gate electrode is present and a region in which the gate electrode is not present. To put it differently, by using the light absorbing layer 16 having the predetermined optical characteristics, the absorptance in the region in which the gate electrode is present and the region in which the gate electrode is not present. Note that, the light absorbing layer 16 having the predetermined optical characteristics is made of a diamond-like carbon film.

The following shall describe the thickness of the gate insulating layer 13, the thickness of the amorphous silicon layer 14, the thickness of the buffer layer 15, and the thickness of the light absorbing layer 16.

The thicknesses of the gate insulating layer 13, the amorphous silicon layer 14, the buffer layer 15, and the light absorbing layer 16 are formed so as to satisfy X and Y in a range divided by the following Expressions 1 to 4, for example.

$$Y \leq -1.06X - 0.22\Delta A' + 1.07 \quad \text{(Expression 1)}$$

$$Y \geq 1.29X + 1.61 * \Delta A' + 1.44 \quad \text{(Expression 2)}$$

$$Y \geq 1.06X + 0.33\Delta A' + 0.89 \quad \text{(Expression 3)}$$

$$Y \leq 1.29X + -0.97 * \Delta A' - 0.95 \quad \text{(Expression 4)}$$

X represents the value obtained by dividing the optical film thickness of the light absorbing layer 16 by the predetermined laser beam wavelength, where the optical film thickness of the light absorbing layer 16 is a result of multiplying the refractive index of the light absorbing layer 16 by the film thickness of the light absorbing layer 16. Y represents the value obtained by dividing a sum of the optical thickness of the gate insulating layer 13, the optical thickness of the amorphous silicon layer 14, and the optical thickness of the buffer layer 15 by the wavelength of the predetermined laser beam, where the optical thickness of the gate insulating layer 13 is a result of multiplying the refractive index of the gate insulating layer 13 by the thickness of the gate insulating layer 13, the optical thickness of the amorphous silicon layer is a result of multiplying the refractive index of the amorphous silicon layer 14 by the thickness of the amorphous silicon layer 14, and the optical thickness of the buffer layer is a result of multiplying the refractive index of the buffer layer 14 and the thickness of the buffer layer 15.

More specifically, $A_1$ denotes the absorptance, for the laser beam, of the light absorbing layer 16 above the region in which the gate electrode 12 is formed (hereafter referred to as the first region), and converted absorptance $A_1'$ denotes the absorptance $A_1$ divided by the thickness $d_1$ of the light absorbing layer 16. $A_2$ denotes the absorptance, for the laser beam, of the light absorbing layer 16 above the region in which the gate electrode 12 is not formed (hereafter referred to as the second region), and converted absorptance $A_2'$ denotes the absorptance $A_1$ divided by the thickness $d_2$ of the light absorbing layer 16. Here, the difference $A_1' - A_2'$ is less than or equal to $-\Delta A'$ which is a value defined by the description to be made later. Stated differently, in steps S12, S13, and S14, the gate insulating layer 13, the amorphous silicon layer 14, the buffer layer 15, and the light absorbing layer 16 having thicknesses satisfying the relational expression (Expression 5) are formed.

$$A_1' - A_2' \leq -\Delta A' \quad \text{(Expression 5)}$$

Note that, although the detailed description shall be made later and the description here is omitted, the absorptance of the light absorbing layer 16 is derived by an optical calculation in consideration of the multiple interferences of the laser beam, using the thickness and optical constant of the light absorbing layer 16, the thickness and optical constant of the buffer layer 15, the thickness and optical constant of the amorphous silicon layer 14, the structure, thickness, and optical constant of the gate insulating layer, and the optical constant of the metal material forming the gate electrode 12 which is underneath, and the optical constant of the substrate as parameters. The description goes back to the manufacturing process again.

Next, the light absorbing layer 16 is irradiated with the laser in the red or near-infrared region so as to heat the light absorbing layer 16, and the crystalline silicon layer 17 is formed by annealing the amorphous silicon layer 14 with the heat (S15).

More specifically, the laser having a wavelength from 600 nm to 2000 nm is moved in a constant direction relative to the substrate 10 so as to heat the light absorbing layer 16 with the laser beam emitted from the laser, thereby annealing the amorphous silicon layer 14 indirectly via the buffer layer 15 to form the crystalline silicon layer 17. In more detail, first, dehydrogenation is performed on the formed amorphous silicon layer 14. For example, the dehydrogenation is performed in an atmosphere of nitride at 500° C. for 20 minutes. After this, the amorphous silicon layer 14 is changed into polycrystalline form (including microcrystalline form) by the indirect heating method with laser, as a result of which the crystalline silicon layer 17 is formed (FIG. 5D).

Here, in the laser annealing, the laser light source used for the laser irradiation is a laser of in the red or near-infrared region. More specifically, the laser has a wavelength from approximately 600 nm to 2000 nm, and preferably from 800 nm to 1100 nm. The laser of the wavelength in red or near-infrared region has an oscillation mode that is a continuous wave mode or a quasi-continuous wave mode. Moreover, the laser of the wavelength region may be a solid-state laser device, or a laser device that uses a semiconductor laser element. A variation in irradiation energy density of the laser of the wavelength in the visible region on the amorphous silicon layer 14 is approximately less than 5%.

Figure 5D:
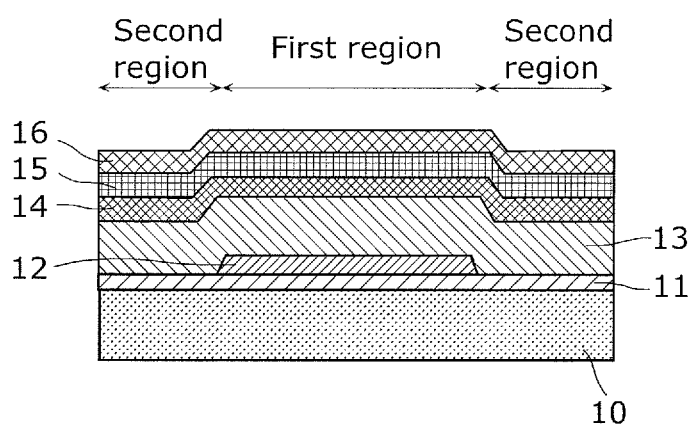
FIG. 5D is a cross-section diagram for describing the manufacturing method of the thin-film transistor in the display device in the embodiment of the present disclosure.
Figure 5E:
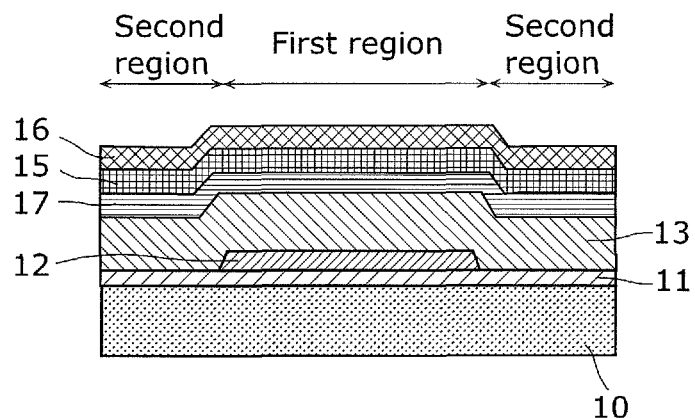
FIG. 5E is a cross-section diagram for describing the manufacturing method of the thin-film transistor in the display device in the embodiment of the present disclosure.
Figure 5F:
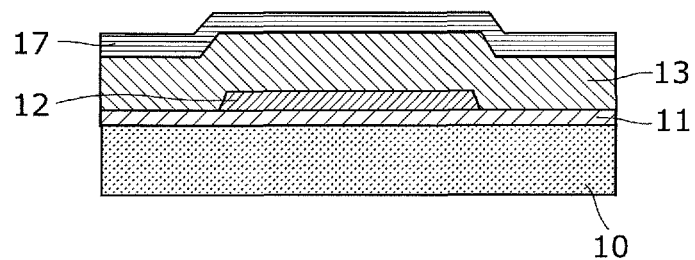
FIG. 5F is a cross-section diagram for describing the manufacturing method of the thin-film transistor in the display device in the embodiment of the present disclosure.

In Step S15, i.e. in the process from FIGS. 5D to 5E, the crystalline silicon layer 17 is produced by irradiating the amorphous silicon layer 14 with linearly focused laser beam, as shown in FIG. 6. There are specifically two methods for such irradiation of the amorphous silicon layer 14 with the laser beam. In one method, an irradiation position of linearly focused laser beam is fixed, and a stage carrying the substrate 10 where the amorphous silicon layer 14 is formed is moved. In the other method, the stage is fixed, and the irradiation position of the laser beam is moved. In both methods, the light absorbing layer 16 is irradiated while moving the laser beam relative to the light absorbing layer 16. The light absorbing layer 16 irradiated with the laser beam in the method described above absorbs the energy from the laser beam, and the temperature of the light absorbing layer 16 increases. The heat is propagated to the amorphous silicon layer 14 via the buffer layer 15, and the amorphous silicon layer 14 is annealed and crystallized. As described above, the amorphous silicon layer becomes the crystalline silicon layer 17.

Next, the light absorbing layer 16, and the buffer layer 15 are removed by etching. More specifically, the light absorbing layer 16 and the buffer layer 15 are removed by dry etching or wet etching. Note that, it is not necessary to remove the light absorbing layer 16 and the buffer layer 15. The light absorbing layer 16 and the buffer layer 15 may be used as the channel etching stopper (CES). Alternatively, only the light absorbing layer may be removed by etching, and the buffer layer may be used as the CES.

Following this, the second amorphous silicon layer 18 is formed (Step S17), and the silicon layer in the channel region of the thin-film transistor 100 is patterned (Step S18).

Figure 5G:
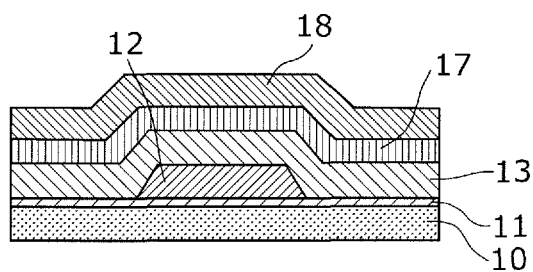
FIG. 5G is a cross-section diagram for describing the manufacturing method of the thin-film transistor in the display device in the embodiment of the present disclosure.
Figure 5H:
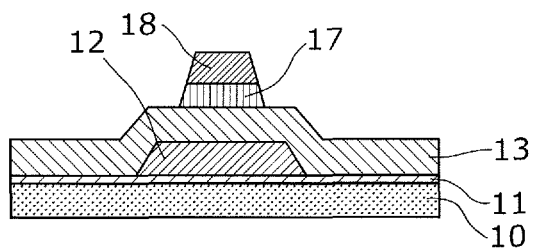
FIG. 5H is a cross-section diagram for describing the manufacturing method of the thin-film transistor in the display device in the embodiment of the present disclosure.

In detail, the second amorphous silicon layer 18 is formed on the gate insulating layer 13 by the plasma CVD (FIG. 5G). The silicon film layer (the crystalline silicon layer 17 and the second amorphous silicon layer 18) is then patterned so that portions of the amorphous silicon layer 18 and the crystalline silicon layer 17 to be removed are removed by etching, while maintaining the channel region of the thin-film transistor 100 (FIG. 5H). With this, the desired channel layer is formed in the thin-film transistor 100.

Next, the n+ silicon layer 19 and the source and drain electrodes 20 are deposited (Step S19).

Figure 5I:
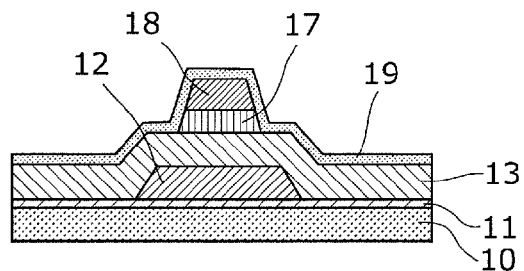
FIG. 5I is a cross-section diagram for describing the manufacturing method of the thin-film transistor in the display device in the embodiment of the present disclosure.
Figure 5J:
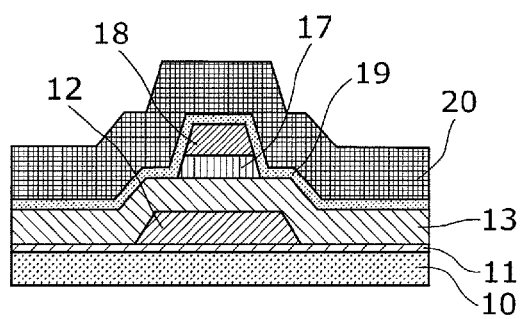
FIG. 5J is a cross-section diagram for describing the manufacturing method of the thin-film transistor in the display device in the embodiment of the present disclosure.

In detail, the n+ silicon layer 19 is deposited so as to cover the gate insulating layer 13 and the side surfaces of the second amorphous silicon layer 18 and the crystalline silicon layer 17, by the plasma CVD (FIG. 5I). The metal for the source-drain electrodes 20 is then deposited on the n+ silicon layer 19 by sputtering (FIG. 5J). Here, the source and drain electrodes 20 are made of a metal material including: metal such as Mo or an Mo alloy; metal such as titanium (Ti) or aluminum (Al), or an Al alloy; metal such as copper (Cu) or a Cu alloy; or metal such as silver (Ag), chromium (Cr), tantalum (Ta), tungsten (W), or the like.

Next, the source-drain electrodes 20 are patterned (Step S20). After this, the n+ silicon layer 19 is etched (Step S21). In this etching, the second amorphous silicon layer 18 is partially etched (Step S22).

Figure 5K:
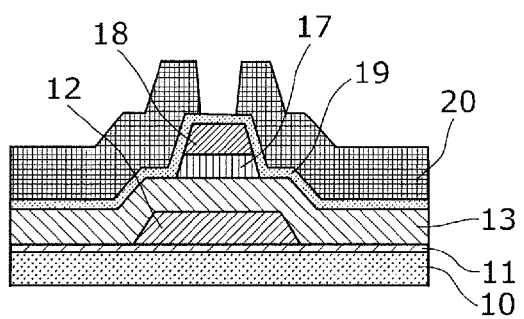
FIG. 5K is a cross-section diagram for describing the manufacturing method of the thin-film transistor in the display device in the embodiment of the present disclosure.
Figure 5L:
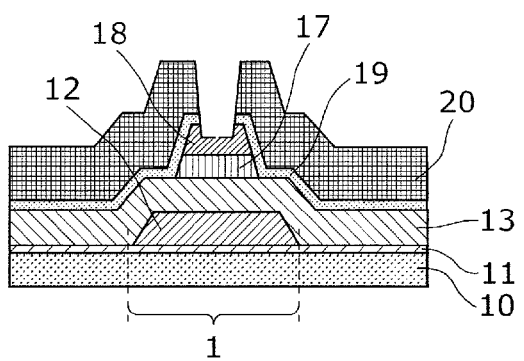
FIG. 5L is a cross-section diagram for describing the manufacturing method of the thin-film transistor in the display device in the embodiment of the present disclosure.

In detail, the source-drain electrodes 20 are formed by photolithography and etching (FIG. 5K). In addition, the n+ silicon layer 19 is etched, and also the amorphous silicon layer 18 in the channel region of the thin-film transistor 100 is partially etched (FIG. 5L). In other words, the amorphous silicon layer 18 is channel-etched so that the amorphous silicon layer 18 in the channel region of the thin-film transistor 100 partially remains.

The thin-film transistor 100 is manufactured in this way.

As described above, the thin-film transistor 100 in this embodiment is formed as a poly-Si TFT having the bottom-gate structure. When manufacturing the thin-film transistor 100, the gate insulating layer 13, the amorphous silicon layer 14, the buffer layer 15, and the light absorbing layer 16 are deposited with the respective film thicknesses that satisfy the aforementioned relational expressions. Subsequently, the amorphous silicon layer 14 made of a-Si film is annealed and crystallized using the heat generated by irradiating and scanning the light absorbing layer 16 with the laser beam, such that the amorphous silicon layer 14 becomes the crystalline silicon layer 17 made of Poly-Si. Here, the gate electrode 12 can be brought into a thermally saturated state before the laser beam reaches the light absorbing layer 16 above the channel region (a region on the gate electrode) of the thin-film transistor 100. This enables uniform crystallization of the crystalline silicon layer 17 corresponding to the eventually created channel region.

That is, there are the appropriate ranges of the film thicknesses of the gate insulating layer 13, the amorphous silicon layer 14, the buffer layer 15, and the light absorbing layer 16 in the case of forming the crystalline silicon layer 17 by laser annealing crystallization.

This mechanism is described below.

Typically, when the amorphous silicon layer is annealed by heating, there is a correlation between a reached temperature of the amorphous silicon layer and a degree of crystallinity of the crystalline silicon layer after crystallization. A higher reached temperature of the amorphous silicon layer by heat generation leads to a higher degree of crystallinity of the crystalline silicon layer formed as a result of crystallization. In view of this, for sufficient and uniform crystallization of the amorphous silicon layer in the first region (located above the region where the gate electrode is formed) in the thin-film transistor, it is necessary to ensure a uniform distribution of the reached temperature of the amorphous silicon layer in the first region in the thin-film transistor.

In the thin-film transistor of the bottom-gate structure, however, the gate electrode is located below the amorphous silicon layer via the gate insulating layer, where the metal forming the gate electrode has higher heat conductivity than the gate insulating layer. Accordingly, in the indirect heating method with laser, heat of the light absorbing layer generated by laser beam irradiation on the light absorbing layer formed above the amorphous silicon layer interposing the buffer layer heats the amorphous silicon layer. At the same time, the heat is instantly transmitted to the gate electrode via the gate insulating layer. This causes an area where heat generation is insufficient to be created in the amorphous silicon layer located above the region where the gate electrode is formed, making the reached temperature of the amorphous silicon layer not uniform. For this reason, non-uniform crystallinity (non-uniform crystallization) occurs in the crystalline silicon layer after crystallization as shown in FIG. 1.

To avoid such a phenomenon that induces non-uniform crystallinity, it is desirable to thermally saturate the gate electrode before the laser beam reaches the light absorbing layer above the first region in the thin-film transistor, as described later. In view of this, the thin-film transistor 100 of the aforementioned structure is manufactured in this embodiment. That is, the gate insulating layer 13, the amorphous silicon layer 14, the buffer layer and the light absorbing layer are formed with the respective film thicknesses so as to satisfy X and Y in the ranges defined above. This allows the light absorbing layer 16 located above the region where the gate electrode 12 is not formed (i.e. in the second region) to generate more heat than the light absorbing layer 16 located above the region where the gate electrode 12 is formed (i.e. in the first region).

In other words, the gate insulating layer 13, the amorphous silicon layer 14, the buffer layer, and the amorphous silicon layer film are formed with the respective film thicknesses so as to satisfy X and Y in the ranges defined above, in the structure of the thin-film transistor 100 in this embodiment. In such a structure, heat generated in the light absorbing layer 16 located above the region where the gate electrode 12 is not formed (i.e. in the second region) by laser beam irradiation is transmitted to the gate electrode 12 through the buffer layer 15, the amorphous silicon layer 14, and the gate insulating layer 13 to cause an increase in temperature of the gate electrode 12, before the laser beam reaches the light absorbing layer 16 located above the region where the gate electrode 12 is formed (i.e. in the first region). Thus, the gate electrode 12 is preheated before the laser beam reaches. This is because, when the light absorbing layer 16 in the second region is irradiated with the laser beam to generate heat, the temperature of the light absorbing layer 16 is higher in the second region than in the first region where the laser beam has not reached yet due to the aforementioned structure, so that heat transmitted to the amorphous silicon layer 14 in the second region is transmitted to the gate electrode 12 through the gate insulating film, and increases the temperature of the gate electrode 12. Subsequently, when the laser beam reaches the light absorbing layer 16 above the first region, the light absorbing layer 16 above the first region generates heat, and the heat is transmitted to the amorphous silicon layer 14. The heat corresponding to the heating value generated in the light absorbing layer 16 in the first region is transmitted to the gate electrode 12 (heating by laser beam). The gate electrode 12 is heated by both this laser beam heating and the preheating mentioned earlier, and as a result thermally saturated. Here, thermally saturating the gate electrode 12 means that the in-plane temperature of the gate electrode 12 is made uniform.

Thus, according to the structure of the thin-film transistor in this embodiment, the gate electrode 12 can be thermally saturated when crystallizing the amorphous silicon layer 14. This provides an advantageous effect of producing the crystalline silicon layer 17 of uniform crystallinity, because heat in the light absorbing layer by laser beam for crystallizing the amorphous silicon layer 14 is used to form the crystalline silicon layer 17 without being absorbed by the gate electrode 12.

The following describes a method of calculating $\Delta A'$. As noted above, the advantageous effects of this embodiment can be achieved when the difference in converted absorptance for the laser beam between the light absorbing layer 16 located above the region where the gate electrode 12 is formed (i.e. in the first region) and the light absorbing layer 16 located above the region where the gate electrode 12 is not formed (i.e. in the second region) is equal to or less than $-\Delta A'$.

It is assumed here that 100% of energy of the laser beam absorbed by the light absorbing layer 16 contributes to heat generation of the light absorbing layer 16, with energy of the laser beam per unit area being denoted as an energy density E. In the following description, the light absorbing layer 16 located above the region where the gate electrode 12 is formed (i.e. in the first region) is referred to as the light absorbing layer 16 in the first region, whereas the light absorbing layer 16 located above the region where the gate electrode 12 is not formed (i.e. in the second region) is referred to as the light absorbing layer 16 in the second region. Let $A_1$ be the absorptance of the light absorbing layer 16 in the first region for the wavelength of the laser beam, and $Q_1$ be the heating value (per unit area) generated in the light absorbing layer 16 as a result of absorbing the laser beam. Let $A_2$ be the absorptance of the light absorbing layer 16 in the second region for the wavelength of the laser beam, and $Q_2$ be the heating value (per unit area) generated in the light absorbing layer 16 as a result of absorbing the laser beam. Moreover, in the structure in which the gate insulating layer 13 is formed on the gate electrode 12 and the amorphous silicon layer 14 is formed on the gate insulating layer 13, let $A_G$ be the laser beam absorptance of the gate electrode 12, and $Q_G$ be the heating value (per unit area) of the gate electrode 12 as a result of absorbing the laser beam.

Suppose, when the gate insulating layer 13, the amorphous silicon layer 14, the buffer layer 15, and the light absorbing layer 16 have predetermined film thicknesses, the absorptance of the light absorbing layer 16 in the first region for the wavelength of the laser beam and the absorptance of the light absorbing layer 16 in the second region for the wavelength of the laser beam are equal to each other. More specifically, a case in which $A_1=A_2$ is considered. In such a case, $Q_1=Q_2$. In actuality, however, light passing through the light absorbing layer 16 is also absorbed by the gate electrode 12 and so the gate electrode 12 generates heat, too ($Q_G>0$). Hence, the amorphous silicon layer 14 in the first region has a higher heat generation temperature than the amorphous silicon layer 14 in the second region.

The above suggests that, when the heating value of the light absorbing layer 16 in the second region is equal to or higher than a total sum of the heating value of the light absorbing layer 16 in the first region and the heating value of the gate electrode 12, the heat generation temperature of the amorphous silicon layer 14 in the second region is equal to or higher than the heat generation temperature of the amorphous silicon layer 14 in the first region. This relation can be represented by (Expression 6).

$$Q_2 + Q_G \leq Q_2 \quad \text{(Expression 6)}$$

Modifying (Expression 6) yields (Expression 7).

$$Q_1 - Q_2 \leq -Q_G \quad \text{(Expression 7)}$$

When the film thickness, the density, and the specific heat of the light absorbing layer 16 are respectively denoted by d, $\rho$, and c and the film thickness, the density, and the specific heat of the gate electrode 12 are respectively denoted by $d_G$, $\rho_G$, and $c_G$, the heating value in the light absorbing layer 16 in the first region, the heating value in the light absorbing layer 16 in the second region, and the heating value in the gate electrode 12 can be expressed as follows.

$$Q_1 = E \times A_1/(d \times \rho \times c)$$

$$Q_2 = E \times A_2/(d \times \rho \times c)$$

$$Q_G = E \times A_G/(d_G \times \rho_G \times c_G)$$

Substituting these expressions into (Expression 7) and rearranging (Expression 7) yields (Expression 8).

$$(A_1-A_2)/d \leq -(A_G/d_G) \times (\rho \times c)/(\rho_G \times c_G) \quad \text{(Expression 8)}$$

Here, the result of dividing the absorptance by the film thickness is defined as the converted absorptance, so that $A_1/d=A_1'$ and $A_2/d=A_2'$. In addition, the right side of (Expression 8) is defined as $-\Delta A'$. Since (Expression 7) can be written as $A_1'-A_2' \leq -\Delta A'$, (Expression 5) is derived.

(Expression 5) indicates the following. When the film thicknesses of the gate insulating layer 13, the amorphous silicon layer 14, the buffer layer, and the light absorbing layer satisfy the condition that the difference between the converted absorptance of the light absorbing layer 16 in the first region and the converted absorptance of the light absorbing layer 16 in the second region is equal to or less than the value defined as $-\Delta A'$, the heat generation temperature of the amorphous silicon layer 14 in the second region is equal to or higher than the heat generation temperature of the amorphous silicon layer 14 in the first region. By forming the gate insulating layer 13, the amorphous silicon layer 14, the buffer layer, and the light absorbing layer with the respective film thicknesses that satisfy this condition, in the case of indirect laser annealing the amorphous silicon layer 14 using, for example, the heat generated by a laser in the red wavelength region irradiating and scanning the light absorbing layer formed above the amorphous silicon layer interposing the buffer layer, the influence of heat absorption and heat transmission by the gate electrode 12 on the crystallization can be reduced. Hence, the distribution of the reached temperature of the amorphous silicon layer 14 in the first region in the thin-film transistor 100 by heat generation can be made uniform.

Note that, it is necessary that the absorptance of the light absorbing layer 16 changes along with the change in the layer structure (whether or not the gate electrode 12 is present) and the thickness of the layer, in order to achieve the effect described above. This is because, in the predetermined region (in the red or near-infrared region) of the laser beam, it is necessary that the light absorbing layer 16 is translucent; that is, having an extinction coefficient k<1. With the optical characteristics, the light absorbing layer transmits the incident laser beam to a lower layer, causing the multiple interference in the lower layer film. Accordingly, the multiple interference effect changes as the structure of the layers and the thicknesses of the layers change. Therefore, it is possible to control the difference between the absorptance of the light absorbing layer 16 on the gate electrode and the absorptance of the light absorbing layer outside of the gate electrode 12.

In contrast, the light absorbing layer frequently used for the conventional indirect heating method with laser is metals having high melting points such as Mo and Cr. The metals with high melting points have large extinction coefficients greater than or equal to 2. Thus, the incident laser beam is barely transmitted to the lower layer film, and the multiple interference in the lower layer film is not likely to occur (or is very small). In other words, the absorptance of the light absorbing layer is constant regardless of the change in the structure of the layer and the thickness of the layer. Thus, the effect according to the present disclosure is not achieved.

Therefore, the difference from the conventional technology is that the light absorbing layer 16 has the optical characteristics, that is, translucent to the laser beam having the predetermined wavelength, upon achieving the effect of the present disclosure.

As described above, by forming the gate insulating layer 13, the amorphous silicon layer 14, the buffer layer 15, and the light absorbing layer 16 with the respective film thicknesses so as to satisfy the aforementioned condition, the crystalline silicon layer 17 of uniform crystallinity can be produced even with various laser beam wavelengths and gate electrode materials and film thicknesses. A variation in crystallinity in the crystalline silicon layer 17 formed above the gate electrode 12 can be reduced to achieve stable crystallization, without a particular change in the structure of the thin-film transistor 100 such as the pattern shape of the gate electrode 12. As a result, a variation in characteristics of the thin-film transistor 100 that uses the crystalline silicon layer 15 can be suppressed. This provides an advantageous effect of improving display quality of a display device such as a LCD or an OLED even in the case where the display device is increased in resolution.

Though an example where the amorphous silicon layer 14 is crystallized using linearly focused laser beam is described here, the present disclosure may also be applied to spot laser beam (circular, elliptic, and so on). In this case, a laser beam scan method suitable for crystallization is preferably employed.

As described above, according to the manufacturing method of the thin-film transistor 100 in this embodiment, the film thicknesses of the gate insulating layer 13, the amorphous silicon layer 14, the buffer layer 15, and the light absorbing layer 16 satisfy the aforementioned condition to ensure a uniform distribution of the reached temperature of the amorphous silicon layer 14 in the first region by heat generation, as a result of which the amorphous silicon layer 14 in the first region can be sufficiently and uniformly crystallized.

The conditions to be satisfied by the film thicknesses of the gate insulating layer 13, the amorphous silicon layer 14, the buffer layer 15, and the light absorbing layer 16 are described in detail below, by way of an example.

Example

A calculation method of the absorptance in the light absorbing layer with respect to the wavelength of the laser beam is described first.

Figure 7A:
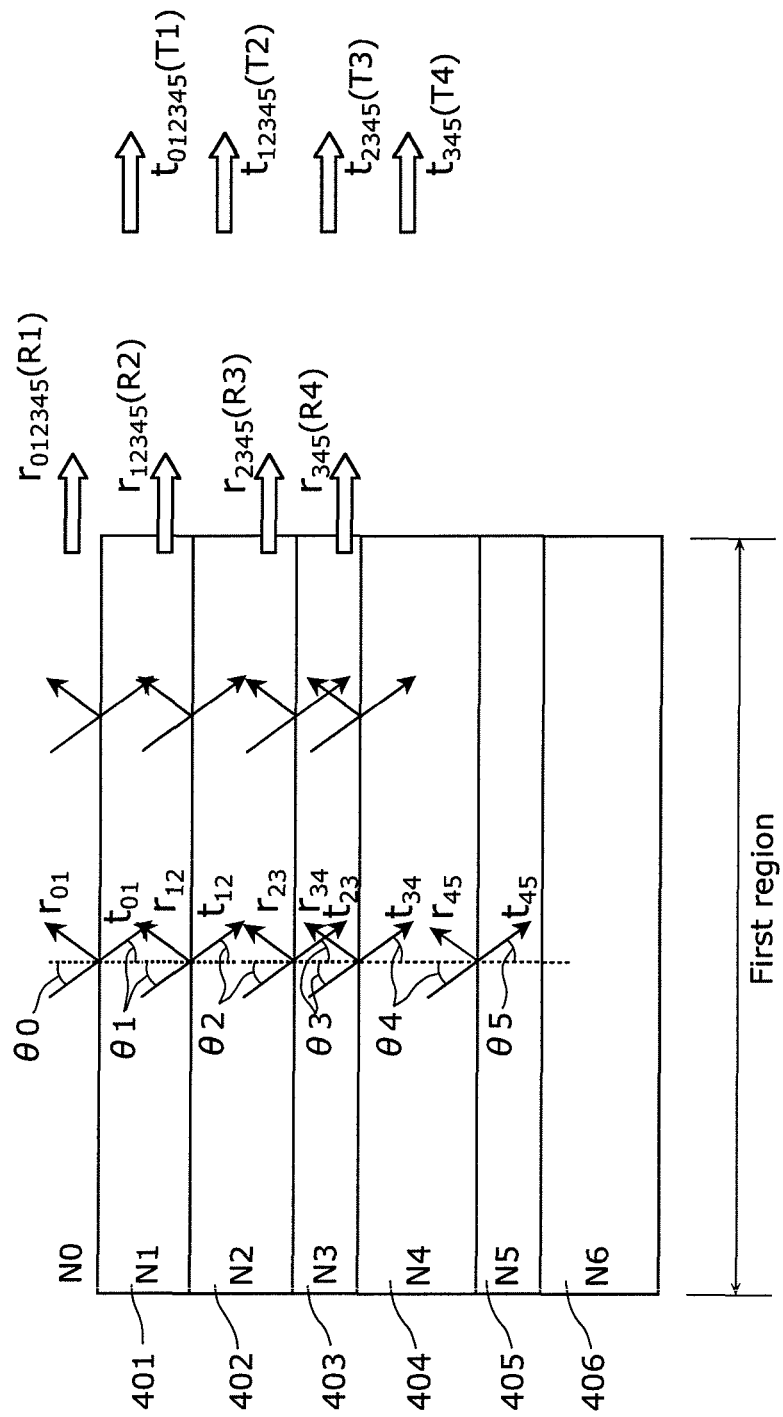
FIG. 7A is a diagram for describing a method of calculating an amplitude reflectance and an amplitude transmittance.
Figure 7B:
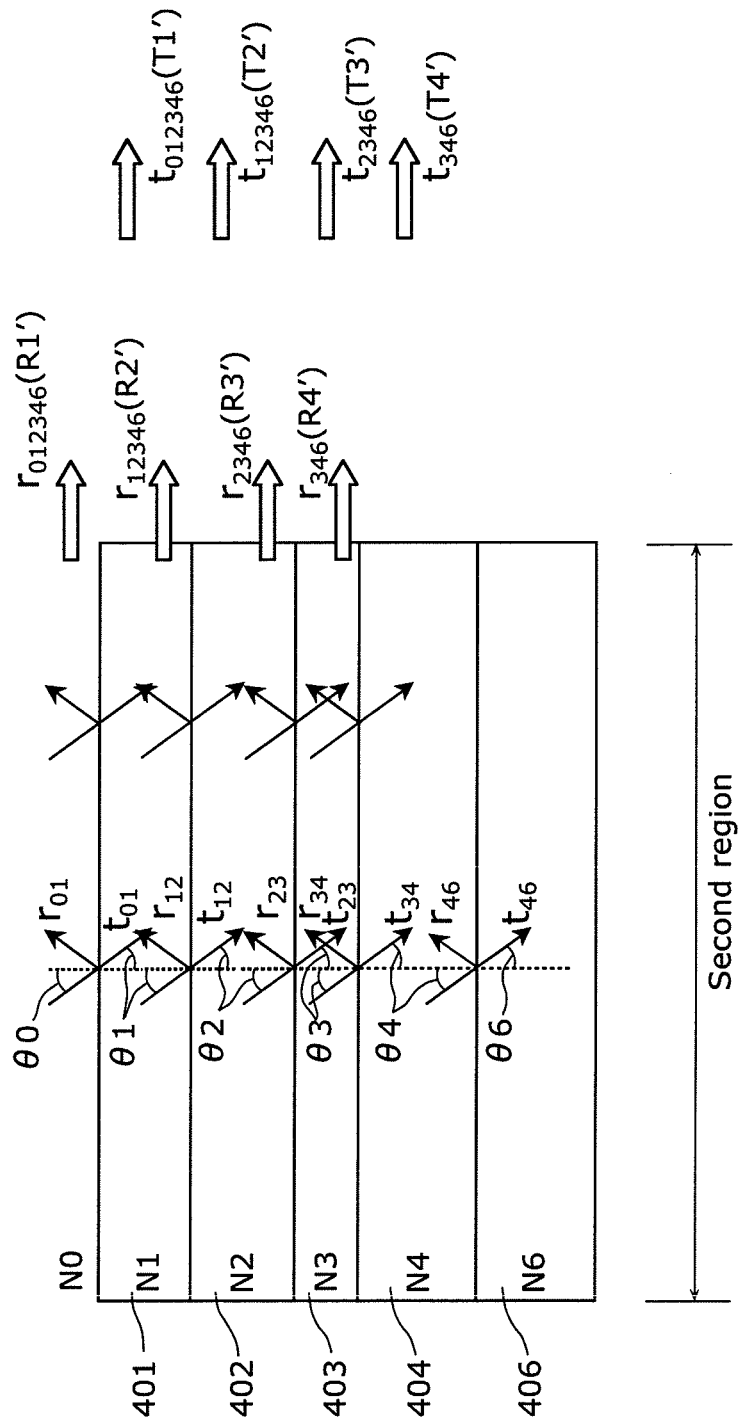
FIG. 7B is a diagram for describing a method of calculating an amplitude reflectance and an amplitude transmittance.

FIGS. 7A and 7B are diagrams for describing a method of calculating an amplitude reflectance and an amplitude transmittance.

FIGS. 7A and 7B each show a model structure of a multi-layer structure that models the structure of the thin-film transistor 100 shown in FIG. 2. A model structure shown in FIG. 7A includes a layer 401 having a complex refractive index $N_1$, a layer 402 having a complex refractive index $N_2$, a layer 403 having a complex refractive index $N_3$, a layer 404 having a complex refractive index $N_4$, a substrate 405 having a complex refractive index $N_5$ and a substrate 406 having a complex reflective index $N_6$. In this model structure, the layers 405, 404, 403, 402, and 401 are formed on the substrate 406 in order. A model structure shown in FIG. 7B is a model structure in which the layer 405 in FIG. 7A is omitted. A region having a complex refractive index $N_0$ in each of FIGS. 7A and 7B is outside the model structure, on a side where the laser beam enters the model structure. For instance, this region is air. In such a case, the region has a refractive index of 1 and an extinction coefficient of 0.

The substrate 406 is an insulation substrate made of, for example, transparent glass or quartz, has a refractive index of 1.46 as an example, and corresponds to the substrate 10 shown in FIG. 5A. The layer 405 has a refractive index of 3.55 and an extinction coefficient of 3.86 as an example, made of MoW with a film thickness of 50 nm, and corresponds to the gate electrode 12 shown in FIG. 5A. The layer 404 is made of silicon oxide ($SiO_x$) having a refractive index of 1.46 and an extinction coefficient of 0 as an example, and corresponds to the gate insulating film 13 illustrated in FIG. 5B. The layer 403 is made of a-Si having a refractive index of 4.19 and an extinction coefficient of 0 as an example, and corresponds to the amorphous silicon layer 14 illustrated in FIG. 5C. The layer 402 is made of a transparent film having a refractive index of 1.46 and an extinction coefficient of 0 as an example, and corresponds to the buffer layer 15 illustrated in FIG. 5D. The layer 401 is made of diamond-like carbon film having a refractive index of 1.9 and an extinction coefficient of 0.6 as an example, and corresponds to the light absorbing layer 16 in FIG. 5D.

Note that a layer corresponding to the undercoat layer 11 illustrated in FIG. 5A is omitted in this model structure, for the following reason. Given that the undercoat layer 11 is a transparent layer and does not absorb the laser beam, the undercoat layer 11 does not affect the result of calculation regardless of its film thickness. Accordingly, the following calculation is performed using the model structure in which the layer corresponding to the undercoat layer 11 is omitted.

As shown in FIGS. 7A and 7B, $r_{01}$ denotes an amplitude reflection coefficient for light entering the layer 401 from outside, $r_{12}$ denotes an amplitude reflection coefficient for light entering the layer 402 from the layer 401, $r_{23}$ denotes an amplitude reflection coefficient for light entering the layer 403 from the layer 402, $r_{34}$ denotes an amplitude reflection coefficient for light entering the layer 404 from the layer 403, $r_{45}$ denotes an amplitude reflection coefficient for light entering the substrate 405 from the layer 404, and $r_{46}$ denotes an amplitude reflection coefficient for light entering the substrate 406 from the layer 404. Meanwhile, $t_{01}$ denotes an amplitude transmission coefficient for light entering the layer 401 from outside, $t_{12}$ denotes an amplitude transmission coefficient for light entering the layer 402 from the layer 401, $t_{23}$ denotes an amplitude transmission coefficient for light entering the layer 403 from the layer 402, $t_{34}$ denotes an amplitude transmission coefficient for light entering the layer 404 from the layer 403, and $t_{46}$ denotes an amplitude transmission coefficient for light entering the substrate 406 from the layer 404.

Further, $r_{012345}$ (R1), $r_{12345}$ (R2), $r_{2345}$ (R3), and $r_{345}$ (R4) each denote an amplitude reflection coefficient of all layers located above a region where the layer 405 corresponding to the gate electrode 12 is formed (corresponding to the first region). In detail, $r_{345}$ (R4) denotes an amplitude reflection coefficient when the layers 405 and 404 are regarded as one layer. Likewise, $r_{2345}$ (R3) denotes an amplitude reflection coefficient when the layers 405, 404, and 403 are regarded as one layer, $r_{12345}$ (R2) denotes an amplitude reflection coefficient when the layers 405, 404, 403, and 402 are regarded as one layer, and $r_{012345}$ (R1) denotes an amplitude reflection coefficient when the layers 405, 404, 403, 402, and 401 are regarded as one layer. Meanwhile, $t_{012345}$ (T1), $t_{12345}$ (T2), $t_{2345}$ (T3), and $t_{345}$ (T4) each denote an amplitude transmission coefficient of all layers in the first region. In detail, $t_{345}$ (T4) denotes an amplitude transmission coefficient when the layers 405 and 404 are regarded as one layer. Likewise, $t_{2345}$ (T3) denotes an amplitude transmission coefficient when the layers 405, 404, and 403 are regarded as one layer, $t_{12345}$ (T2) denotes an amplitude transmission coefficient when the layers 405, 404, 403, and 402, are regarded as one layer, and $t_{012345}$ (T1) denotes an amplitude transmission coefficient when the layers 405, 404, 403, 402, and 401 are regarded as one layer.

As shown in FIG. 7B, $r_{012346}$ (R1'), $r_{12346}$ (R2'), $r_{2346}$ (R3'), and $r_{346}$ (R4') each denote an amplitude reflection coefficient of all layers located above a region where the layer 405 corresponding to the gate electrode 12 is not formed (corresponding to the second region). In detail, $r_{346}$ (R4') denotes an amplitude reflection coefficient when the substrate 406 and the layer 404 are regarded as one layer. Likewise, $r_{2346}$ (R3') denotes an amplitude reflection coefficient when the substrate 406 and the layers 404 and 403 are regarded as one layer, $r_{12346}$ (R2') denotes an amplitude reflection coefficient when the substrate 406 and the layers 404, 403, and 402 are regarded as one layer, and $r_{012346}$ (R1') denotes an amplitude reflection coefficient when the substrate 406 and the layers 404, 403, 402 and 401 are regarded as one layer. Meanwhile, $t_{012346}$ (T1'), $t_{12346}$ (T2'), $t_{2346}$ (T3'), and $t_{346}$ (T4') each denote an amplitude transmission coefficient of all layers in the second region. In detail, $t_{346}$ (T4') denotes an amplitude transmission coefficient when the substrate 406 and the layer 403 are regarded as one layer. Likewise, $t_{2346}$ (T3') denotes an amplitude transmission coefficient when the substrate 406 and the layers 404 and 403 are regarded as one layer, $t_{12346}$ (T2') denotes an amplitude transmission coefficient when the substrate 406 and the layers 404, 403, and 402 are regarded as one layer, and $t_{012346}$ (T1') denotes an amplitude transmission coefficient when the substrate 406 and the layers 404, 403, 402, and 401 are regarded as one layer.

The amplitude reflection coefficient and the amplitude transmission coefficient of all layers in the first region can be represented by the following (Expression 9) to (Expression 16).

[Math. 1]
$$r_{012345} = \frac{r_{01} + r_{12345}\exp(-i2\beta_1)}{1 + r_{01}r_{12345}\exp(-i2\beta_1)} \quad \text{(Expression 9)}$$

[Math. 2]
$$r_{12345} = \frac{r_{12} + r_{2345}\exp(-i2\beta_2)}{1 + r_{12}r_{2345}\exp(-i2\beta_2)} \quad \text{(Expression 10)}$$

[Math. 3]
$$r_{2345} = \frac{r_{23} + r_{345}\exp(-i2\beta_3)}{1 + r_{23}r_{345}\exp(-i2\beta_3)} \quad \text{(Expression 11)}$$

[Math. 4]
$$r_{345} = \frac{r_{34} + r_{45}\exp(-i2\beta_4)}{1 + r_{34}r_{45}\exp(-i2\beta_4)} \quad \text{(Expression 12)}$$

[Math. 5]
$$t_{012345} = \frac{t_{01} + t_{12345}\exp(-i2\beta_1)}{1 + r_{01}r_{12345}\exp(-i2\beta_1)} \quad \text{(Expression 13)}$$

[Math. 6]
$$t_{12345} = \frac{t_{12} + t_{2345}\exp(-i2\beta_2)}{1 + r_{12}r_{2345}\exp(-i2\beta_2)} \quad \text{(Expression 14)}$$

[Math. 7]
$$t_{2345} = \frac{t_{23} + t_{345}\exp(-i2\beta_3)}{1 + r_{23}r_{345}\exp(-i2\beta_3)} \quad \text{(Expression 15)}$$

[Math. 8]
$$t_{345} = \frac{t_{34} + t_{45}\exp(-i2\beta_4)}{1 + r_{34}r_{45}\exp(-i2\beta_4)} \quad \text{(Expression 16)}$$

The amplitude reflection coefficient and the amplitude transmission coefficient of all layers in the second region can be represented by the following (Expression 17) to (Expression 24).

[Math. 9]
$$r_{012346} = \frac{r_{01} + r_{12346}\exp(-i2\beta_1)}{1 + r_{01}r_{12346}\exp(-i2\beta_1)} \quad \text{(Expression 17)}$$

[Math. 10]
$$r_{12346} = \frac{r_{12} + r_{2346}\exp(-i2\beta_2)}{1 + r_{12}r_{2346}\exp(-i2\beta_2)} \quad \text{(Expression 18)}$$

[Math. 11]
$$r_{2346} = \frac{r_{23} + r_{346}\exp(-i2\beta_3)}{1 + r_{23}r_{346}\exp(-i2\beta_3)} \quad \text{(Expression 19)}$$

[Math. 12]
$$r_{346} = \frac{r_{34} + r_{46}\exp(-i2\beta_4)}{1 + r_{34}r_{46}\exp(-i2\beta_4)} \quad \text{(Expression 20)}$$

[Math. 13]

-continued $$t_{012346} = \frac{t_{01} + t_{12346}\exp(-i2\beta_1)}{1 + r_{01}r_{12346}\exp(-i2\beta_1)} \quad \text{(Expression 21)}$$

[Math. 14]

$$t_{12346} = \frac{t_{12} + t_{2346}\exp(-i2\beta_2)}{1 + r_{12}r_{2346}\exp(-i2\beta_2)} \quad \text{(Expression 22)}$$

[Math. 15]

$$t_{2346} = \frac{t_{23} + t_{346}\exp(-i2\beta_3)}{1 + r_{23}r_{346}\exp(-i2\beta_3)} \quad \text{(Expression 23)}$$

[Math. 16]

$$t_{346} = \frac{t_{34} + t_{46}\exp(-i2\beta_4)}{1 + r_{34}r_{46}\exp(-i2\beta_4)} \quad \text{(Expression 24)}$$

Here,

[Math. 17]

$$\beta_1 = 2\pi d_1 N_1 \cos\theta_1/\lambda$$

[Math. 18]

$$\beta_2 = 2\pi d_2 N_2 \cos\theta_2/\lambda$$

[Math. 19]

$$\beta_3 = 2\pi d_3 N_3 \cos\theta_3/\lambda$$

[Math. 20]

$$\beta_4 = 2\pi d_4 N_4 \cos\theta_2/\lambda$$

where d is the film thickness of each layer, θ is the angle of incidence/transmission in each layer, and λ is the wavelength of the laser beam.

θ can be calculated according to Snell's law in the following manner.

$$N_0 \sin\theta_0 = N_1 \sin\theta_1 = N_2 \sin\theta_2 = N_3 \sin\theta_3 = N_4 \sin\theta_4 = N_5 \sin\theta_5 = N_6 \sin\theta_6 \quad \text{[Math. 21]}$$

The amplitude reflection coefficients $r_{01}$, $r_{12}$, $r_{23}$, $r_{34}$, $r_{45}$, and $r_{46}$ and the amplitude transmission coefficients $t_{01}$, $t_{12}$, $t_{23}$, $t_{34}$, $t_{23}$, $t_{34}$, $t_{45}$, and $t_{46}$ of the individual layers can be calculated using the following (Expression 25) to (Expression 36).

[Math. 22]

$$r_{01} = \frac{N_0\cos\theta_1 - N_1\cos\theta_0}{N_0\cos\theta_1 + N_1\cos\theta_0} \quad \text{(Expression 25)}$$

[Math. 23]

$$r_{12} = \frac{N_1\cos\theta_2 - N_2\cos\theta_1}{N_1\cos\theta_2 + N_2\cos\theta_1} \quad \text{(Expression 26)}$$

[Math. 24]

$$r_{23} = \frac{N_2\cos\theta_3 - N_3\cos\theta_2}{N_2\cos\theta_3 + N_3\cos\theta_2} \quad \text{(Expression 27)}$$

[Math. 25]

$$r_{34} = \frac{N_3\cos\theta_4 - N_4\cos\theta_3}{N_3\cos\theta_4 + N_4\cos\theta_3} \quad \text{(Expression 28)}$$

[Math. 26]

$$r_{45} = \frac{N_4\cos\theta_5 - N_5\cos\theta_4}{N_4\cos\theta_5 + N_5\cos\theta_4} \quad \text{(Expression 29)}$$

[Math. 27]

$$r_{46} = \frac{N_4\cos\theta_6 - N_6\cos\theta_4}{N_4\cos\theta_6 + N_6\cos\theta_4} \quad \text{(Expression 30)}$$

[Math. 28]

$$t_{01} = \frac{2N_0\cos\theta_1}{N_0\cos\theta_1 + N_1\cos\theta_0} \quad \text{(Expression 31)}$$

[Math. 29]

$$t_{12} = \frac{2N_1\cos\theta_2}{N_1\cos\theta_2 + N_2\cos\theta_1} \quad \text{(Expression 32)}$$

[Math. 30]

$$t_{23} = \frac{2N_2\cos\theta_3}{N_2\cos\theta_3 + N_3\cos\theta_2} \quad \text{(Expression 33)}$$

[Math. 31]

$$t_{34} = \frac{2N_3\cos\theta_4}{N_3\cos\theta_4 + N_4\cos\theta_3} \quad \text{(Expression 34)}$$

[Math. 32]

$$t_{45} = \frac{2N_4\cos\theta_5}{N_4\cos\theta_5 + N_5\cos\theta_4} \quad \text{(Expression 35)}$$

[Math. 33]

$$t_{46} = \frac{2N_4\cos\theta_6}{N_4\cos\theta_6 + N_6\cos\theta_4} \quad \text{(Expression 36)}$$

It is assumed here that the light is monochromatic laser beam, and p-polarized.

Following this, the amplitude reflection coefficient and the amplitude transmission coefficient of all layers in the first region are calculated as follows, using the aforementioned expressions. First, $r_{345}$ is calculated by substituting (Expression 28) and (Expression 29) into (Expression 12). Next, $r_{2345}$ is calculated by substituting (Expression 27) and $r_{345}$ into (Expression 11). Next, $r_{12345}$ is calculated by substituting (Expression 26) and $r_{2345}$ into (Expression 10). Next, $r_{012345}$ is calculated by substituting (Expression 25), and $r_{12345}$ into (Expression 9). Next, $t_{345}$ is calculated by substituting (Expression 28), (Expression 29), (Expression 34), and (Expression 35) into (Expression 16). Next, $t_{2345}$ is calculated by substituting (Expression 27), (Expression 33), $r_{345}$, and $t_{345}$ into (Expression 15). Next, $t_{12345}$ is calculated by substituting (Expression 26), (Expression 32), $r_{2345}$, and $t_{2345}$ into (Expression 14). Next, $t_{012345}$ is calculated by substituting (Expression 25), (Expression 31), $r_{12345}$, and $t_{12345}$ into (Expression 13).

Following this, the amplitude reflection coefficient and the amplitude transmission coefficient of all layers in the second region are calculated as follows. First, $r_{346}$ is calculated by substituting (Expression 28) and (Expression 30) into (Expression 20). Next, $r_{2346}$ is calculated by substituting (Expression 27) and $r_{346}$ into (Expression 19). Next, $r_{12346}$ is calculated by substituting (Expression 26) and $r_{2346}$ into (Expression 18). Next, $r_{012346}$ is calculated by substituting (Expression 25) and $r_{12346}$ into (Expression 17). Next, $t_{346}$ is calculated by substituting (Expression 28), (Expression 30), (Expression 34), and (Expression 36) into (Expression 24). Next, $t_{2346}$ is calculated by substituting (Expression 27), (Expression 33), $r_{346}$, and $t_{346}$ into (Expression 23). Next, $t_{12346}$ is calculated by substituting (Expression 26), (Expression 32), $r_{2346}$, and $t_{2346}$ into (Expression 22).

Next, $t_{012346}$ is calculated by substituting (Expression 25), (Expression 31), $r_{12346}$, and $t_{12346}$ into (Expression 21).

The reflectance R1, R2, R3, and R4 and the transmittance T1, T2, T3, and T4 of the layers in the first region are then calculated according to (Expression 37) to (Expression 44).

[Math. 34]

$$R_1 = |r_{012345}|^2 \quad \text{(Expression 37)}$$

[Math. 35]

$$R_2 = |r_{12345}|^2 \quad \text{(Expression 38)}$$

[Math. 36]

$$R_3 = |r_{2345}|^2 \quad \text{(Expression 39)}$$

[Math. 37]

$$R_4 = |r_{345}|^2 \quad \text{(Expression 40)}$$

[Math. 38]

$$T_1 = \left(\frac{\text{Re}(N_5)\cos\theta}{\text{Re}(N_0)\cos\theta}\right)|t_{012345}|^2 \quad \text{(Expression 41)}$$

[Math. 39]

$$T_2 = \left(\frac{\text{Re}(N_5)\cos\theta}{\text{Re}(N_1)\cos\theta}\right)|t_{12345}|^2 \quad \text{(Expression 42)}$$

[Math. 40]

$$T_3 = \left(\frac{\text{Re}(N_5)\cos\theta}{\text{Re}(N_2)\cos\theta}\right)|t_{2345}|^2 \quad \text{(Expression 43)}$$

[Math. 41]

$$T_4 = \left(\frac{\text{Re}(N_5)\cos\theta}{\text{Re}(N_3)\cos\theta}\right)|r_{345}|^2 \quad \text{(Expression 44)}$$

The reflectance R1', R2', R3', and R4' and the transmittance T1', T2', T3', and T4' of the layers in the second region are calculated according to (Expression 45) to (Expression 52).

[Math. 42]

$$R_1' = |r_{012346}|^2 \quad \text{(Expression 45)}$$

[Math. 43]

$$R_2' = |r_{12346}|^2 \quad \text{(Expression 46)}$$

[Math. 44]

$$R_3' = |r_{2346}|^2 \quad \text{(Expression 47)}$$

[Math. 45]

$$R_4' = |r_{346}|^2 \quad \text{(Expression 48)}$$

[Math. 46]

$$T_1' = \left(\frac{\text{Re}(N_6)\cos\theta}{\text{Re}(N_0)\cos\theta}\right)|t_{012346}|^2 \quad \text{(Expression 49)}$$

[Math. 47]

$$T_2' = \left(\frac{\text{Re}(N_6)\cos\theta}{\text{Re}(N_1)\cos\theta}\right)|t_{12346}|^2 \quad \text{(Expression 50)}$$

[Math. 48]

$$T_3' = \left(\frac{\text{Re}(N_6)\cos\theta}{\text{Re}(N_2)\cos\theta}\right)|t_{2346}|^2 \quad \text{(Expression 51)}$$

[Math. 49]

$$T_4' = \left(\frac{\text{Re}(N_6)\cos\theta}{\text{Re}(N_3)\cos\theta}\right)|t_{346}|^2 \quad \text{(Expression 52)}$$

Lastly, the light absorptance $A_1$ of the light absorbing layer in the first region can be calculated according to (Expression 53).

[Math. 50]

$$A_1 = 1 - (R_1 + T_1) \quad \text{(Expression 53)}$$

Lastly, the light absorptance $A_2$ of the light absorbing layer in the second region can be calculated according to (Expression 54).

[Math. 51]

$$A_2 = 1 - (R_2 + T_2) \quad \text{(Expression 54)}$$

Thus, the value $\Delta A' = A_1' - A_2'$ (converted absorptance difference) is obtained by subtracting the converted absorptance $A_2'$ ($A_2' = A_2/d$) of the light absorbing layer in the second region from the converted absorptance $A_1'$ ($A_1' = A_1/d$) of the light absorbing layer in the first region can be calculated using the film thickness d of the light absorbing layer.

In the case where the laser beam (laser beam in red or near infrared wavelength region) of the wavelength $\lambda$ (600 nm$\leq\lambda\leq$2000 nm) enters the model structures shown in FIGS. 7A and 7B perpendicularly, i.e. at the incidence angle $\theta_0$ in a range where $\theta_0=0$ or $\sin\theta_0=0$ approximately holds, the converted absorptance of the light absorbing layer in the first region and the converted absorptance of the light absorbing layer in the second region for the laser beam are calculated to find their difference, using the aforementioned calculation method. Note that the same calculation result is obtained even when the laser beam is s-polarized.

Figure 8:
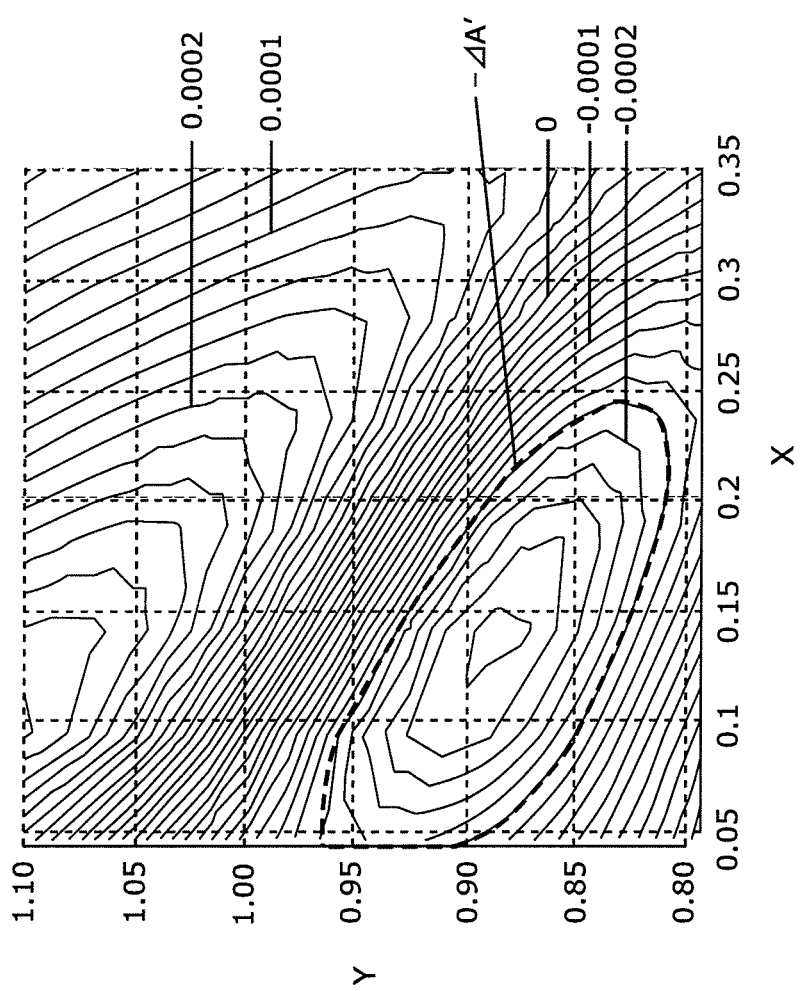
FIG. 8 is a diagram showing that there are appropriate film thickness ranges of a gate insulating layer, an amorphous silicon layer, a buffer layer, and a light absorbing layer in the case of forming a crystalline silicon layer by the indirect heating method with laser.

FIG. 8 is a diagram showing that there are suitable ranges of thicknesses for the gate insulating layer, the amorphous silicon layer, the buffer layer, and the light absorbing layer, when forming the crystalline silicon layer using the indirect heating method with laser. In detail, FIG. 8 is a contour diagram showing a result of calculating the converted absorptance difference $\Delta A' = A_1' - A_2'$ between the light absorbing layer 16 in the first region and the light absorbing layer 16 in the second region, in the case of changing each of the film thicknesses of the gate insulating layer 13, the amorphous silicon layer 14, the buffer layer 15, and the light absorbing layer 16 using the model structures shown in FIGS. 7A and 7B.

A horizontal axis (X) represents the value obtained by dividing the optical film thickness of the light absorbing layer 16 by the predetermined laser beam wavelength, where the optical film thickness of the light absorbing layer 16 is a result of multiplying the refractive index of the light absorbing layer 16 by the film thickness of the light absorbing layer 16. The vertical axis (Y) represents the value obtained by dividing a sum of the optical thickness of the gate insulating layer 13, the optical thickness of the amorphous silicon layer 14, and the optical thickness of the buffer layer 15 by the wavelength of the predetermined laser beam, where the optical thickness of the gate insulating layer 13 is a result of multiplying the refractive index of the gate insulating layer 13 by the thickness of the gate insulating layer 13, the optical thickness of the amorphous silicon layer 14 is a result of multiplying the refractive index of the amorphous silicon layer 14 by the thickness of the amorphous silicon layer 14, and the optical thickness of the buffer layer 15 is a result of multiplying the refractive index of the buffer layer 15 and the thickness of the buffer layer 15.

The value in the horizontal axis in FIG. 8 can be converted to the film thickness of the light absorbing layer 16, through the use of the refractive index of the light absorbing layer 16 when λ=808 nm as an example. FIG. 9 is a diagram showing an example of a result of converting the value in the horizontal axis in FIG. 8 to the film thickness of the light absorbing layer 16. The film thicknesses of the amorphous silicon layer 14 converted from the value in the horizontal axis in FIG. 8 when λ=808 nm, and when λ=1064 nm are shown in FIG. 9.

Figures 10, 11:
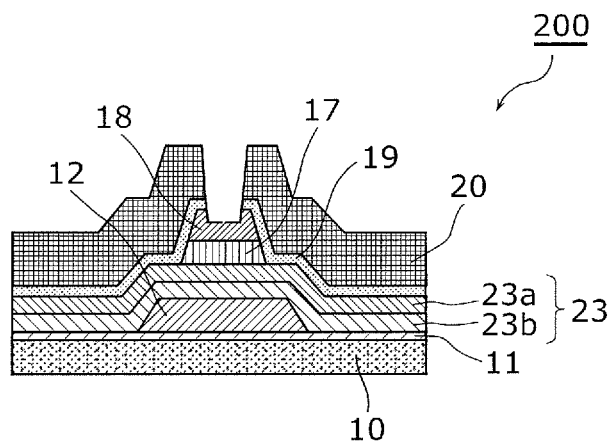
FIG. 10 is a diagram showing an example of a value obtained by converting a value in a vertical axis in FIG. 8 to film thicknesses of the buffer layer.
FIG. 11 is a cross-section diagram showing another example of a structure of a thin-film transistor included in a display device in an embodiment of the present disclosure.

In addition, the film thicknesses of the gate insulating layer 13, the amorphous silicon layer 14, and the buffer layer 15 can be calculated from the value in the vertical axis in FIG. 8, when λ=808 nm, for example. FIG. 10 shows values obtained by converting the values in the horizontal axis of FIG. 8 into the thicknesses of the buffer layer when the thickness of the gate insulating layer (the silicon oxide film) is 125 nm, the thickness of the amorphous silicon layer is 100 nm, λ=808 nm and λ=1064 nm. As described above, by using the thicknesses and optical constant of the gate insulating layer and the thickness and optical constant of the amorphous silicon layer, the vertical axis of FIG. 8 is converted to the thicknesses of the buffer layer 15.

As described above, even if the thicknesses and optical characteristics of the gate insulating layer, the amorphous silicon layer, the buffer layer, and the light absorbing layer, and the structure of the gate insulating layer change, ranges of suitable thicknesses of the gate insulating layer, the amorphous silicon layer, the buffer layer, and the light absorbing layer when forming the crystalline silicon layer by the indirect heating method with laser, by converting the values in the vertical axis X and the horizontal axis Y in FIG. 8.

Note that, when the gate insulating layer 13 has a stacked structure, for example, the values in the vertical axis of FIG. 8 can be converted into the thicknesses of the buffer layer 15 by using a sum of the optical thicknesses (each of which is a product of the refractive index and the thickness of one of the films composing the stacked film) as the optical thickness of the gate insulating film.

FIG. 11 is a cross-section diagram showing another example of a structure of a thin-film transistor included in a display device in an embodiment of the present disclosure. FIG. 12 is a diagram showing a set of thicknesses of a silicon oxide (SiO) film and a silicon nitride (SiN) film when the gate insulating layer in the thin-film transistor illustrated in FIG. 11 is made of the SiO film and the SiN film.

The thin-film transistor 200 shown in FIG. 11 has a gate insulating layer 23 configured of an upper insulating film 23a and a lower insulating film 23b. Here, assume that the upper insulating film 23a is a silicon oxide (SiO) film having a refractive index 1.46 and the lower insulating film 23b is a silicon nitride (SiN) film having a refractive index 1.92. Here, the sets of thicknesses of the SiO film which is the upper insulating layer 23a and the thicknesses of the SiN film which is the lower insulating layer 23b are as shown in FIG. 12 (in a range in which the wavelength λ of the laser beam from 600 nm to 2000 nm), when the gate insulating layer 23 having the stacked structure of the insulating films has an optical constant equal to the gate insulating layer 13 made of a single-layer SiO film of 125 nm in thickness, for example.

Note that, including an SiN film in the gate insulating film blocks impurity such as an alkali metal from glass, an insulating substrate. This is effective for preventing the influence of the impurity on the TFT characteristics and reliability.

In FIG. 8, an area on and inside a contour represented by $-\Delta A'$ is an area where the converted absorptance difference $A_1'-A_2'$ between the light absorbing layer 16 in the first region and the light absorbing layer 16 in the second region is equal to or less than $-\Delta A'$. In other words, a dotted curve in FIG. 8 represents a contour where the converted absorptance difference is $-0.00018$. That is, the converted absorptance difference in the area on and inside the curve is equal to or less than $-0.00018$. This area is calculated from the film thicknesses of the amorphous silicon layer 14 and the gate insulating layer 13, the optical constants of the amorphous silicon layer 14 and the gate insulating layer 13, and the optical constants of the gate electrode 12 and the substrate 10, according to the aforementioned expressions (calculation method). When the calculated converted absorptance difference $A_1'-A_2'$ between the amorphous silicon layer 14 in the first region and the amorphous silicon layer 14 in the second region is equal to or less than $-\Delta A'$, a uniform distribution of the reached temperature of the light absorbing layer 16 in the first region in the thin-film transistor 100 by heat generation can be attained. As a result, the amorphous silicon layer 14 in the first region is sufficiently and uniformly crystallized to become the crystalline silicon layer 17.

Figure 13:
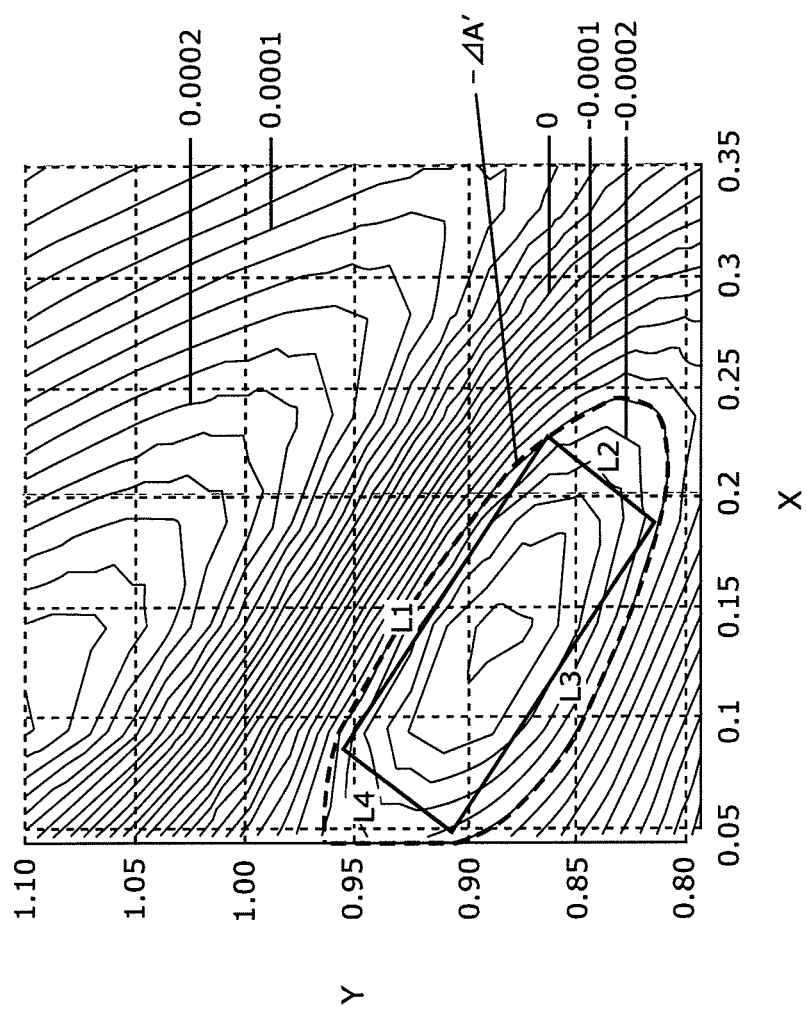
FIG. 13 is a diagram used for calculating the appropriate film thickness ranges of the gate insulating layer and the amorphous silicon layer in FIG. 8.

FIG. 13 is a diagram used for calculating the appropriate film thickness ranges of the gate insulating layer, the amorphous silicon layer, the buffer layer, and the light absorbing layer in FIG. 8.

In FIG. 13, X denotes a value obtained by dividing the optical thickness of the light absorbing layer 16 by the wavelength of the laser beam, and Y denotes a value obtained by dividing a sum of the optical thickness of the gate insulating layer 13, the optical thickness of the amorphous silicon layer, and the optical thickness of the buffer layer by the wavelength of the laser beam. These X and Y are the same as those defined earlier. The area on and inside the contour represented by $-\Delta A'$ is approximated by an expression, using X and Y. That is, the area can be represented by a product of sets denoted by L1 to L4.

$$L1 \cap L2 \cap L3 \cap L4 \qquad \text{[Math. 52]}$$

L1 to L4 can be written as follows, which respectively correspond to (Expression 1) to (Expression 4) mentioned above.

$L1: Y \leq -1.06X - 0.22\Delta A' + 1.07$ $L2: Y \geq 1.29X + 1.61 * \Delta A' + 1.44$ $L3: Y \geq 1.06X + 0.33\Delta A' + 0.89$ $L4: Y \leq 1.29X + -0.97 * \Delta A' - 0.95$ Note that $\Delta A'$ is defined as $\Delta A' = (A_G/d_G) \times (\rho \times c)/(\rho_G \times c_G)$ as mentioned above, where $\rho$ and $c$ are respectively the density and the specific heat of the light absorbing layer 16, and $d_G$, $\rho_G$, and $c_G$ are respectively the film thickness, the density, and the specific heat of the gate electrode 12.

Next, consider the case of applying red laser beam of 808 nm in wavelength perpendicularly from above the model structures shown in FIGS. 7A and 7B. Suppose the light absorbing layer 16 has a density of 1800 (kg/m³) and a specific heat of 970 (J/(kg·K)), and the gate electrode 12 is MoW with a film thickness of 50 nm, a density of 11720 (kg/m³), and a specific heat of 226.4 (J/(kg·K)). In this case, it is assumed that the absorptance of the light absorbing layer 16 in the first region for the wavelength of the laser beam and the absorptance of the light absorbing layer 16 in the second region for the wavelength of the laser beam are equal to each other, that is, $A_1=A_2$. The maximum absorptance $A_G$ of the gate electrode 12 is calculated using the film thicknesses of the gate insulating layer, the amorphous silicon layer, the buffer layer, and the light absorption layer when $A_1=A_2$ and the aforementioned optical expressions (Expression 9) to (Expression 54). As a result, $A_G$=0.25. From this, $\Delta A'$ is calculated at 0.00018. Note that $A_G$ is obtained from a relational expression $A_G$=T1×T2×T3×T4×(1−$R_G$). $R_G$ is a reflectance of the gate electrode 12 in the case where silicon oxide is used as a medium, where $R_G=\{(n_{SiO}-n_G)^2+k_G^2\}/\{(n_{SiO}+n_G)^2+k_G^2\}$. Here, $n_{SiO}$ is the refractive index of silicon oxide, $n_G$ is the refractive index of the gate electrode 12, and $k_G$ is the extinction coefficient of the gate electrode 12. Thus, $\Delta A'$ is calculated at 0.00018. This value is used to determine the range defined by the product of sets denoted by aforementioned L1 to L4.

$$L1 \cap L2 \cap L3 \cap L4 \qquad [\text{Math. 52}]$$

Figure 14:
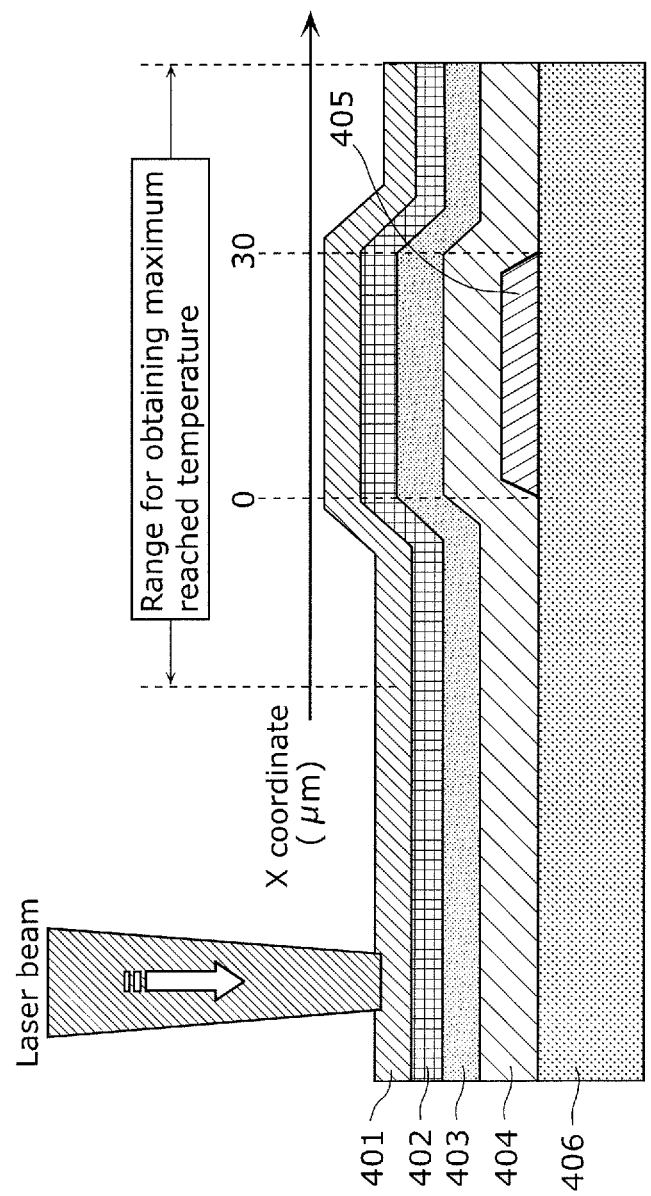
FIG. 14 is a diagram showing a model used for a simulation.

A simulation is performed on positional dependency of the maximum reached temperature of the surface of the amorphous silicon layer 14, a temperature of which is increased by the heat generated at the light absorbing layer, when the models shown in FIGS. 7A and 7B are perpendicularly irradiated and scanned with red laser beam of λ=808 nm. FIG. 14 shows a model used for the simulation. As shown in FIG. 14, the model includes a substrate 406, a layer 405 corresponding to the gate electrode 12, a layer 404 corresponding to the gate insulating layer 13, a layer 403 corresponding to the amorphous silicon layer 14, a layer 402 corresponding to the buffer layer 15, and a layer 401 corresponding to the light absorbing layer 16. In the model, the layer 405 corresponding to the gate electrode 12 has a length of 30 µm in a laser scan direction, and the layer 401 corresponding to the light absorbing layer 16 and the layer 405 corresponding to the gate electrode 12 have physical properties corresponding to the aforementioned values.

Figure 15:
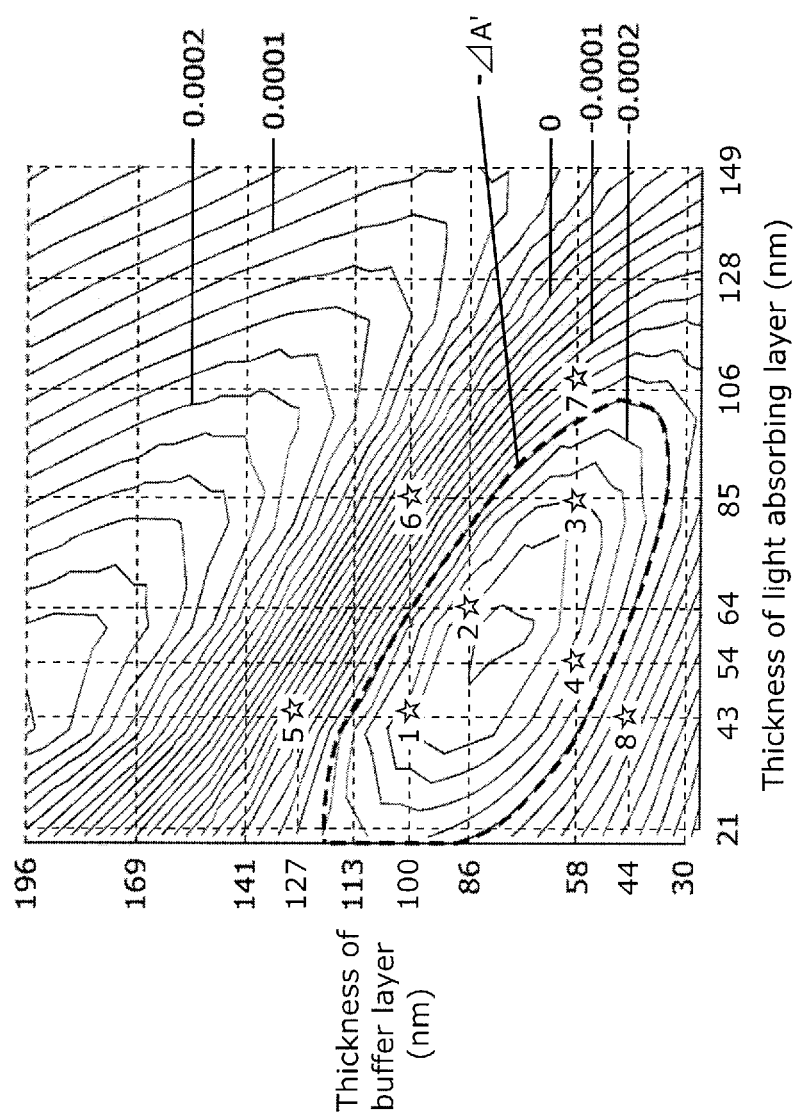
FIG. 15 is a diagram showing film thickness condition points in FIG. 8 which are subject to the simulation.

FIG. 15 is a diagram showing film thickness condition points in FIG. 8 which are subject to the simulation. Here, values in the vertical axis (X) and the horizontal axis (Y) illustrated are converted from the values in the vertical axis (X) and the horizontal axis (Y) illustrated in FIG. 8 using the optical constants of the films when λ=808 nm. In the model used for the simulation, it is assumed that the gate insulating layer 13 is a silicon oxide (SiO) film, and the thickness of the gate insulating layer 13 is 125 nm. It is also assumed that the thickness of the amorphous silicon layer 14 is 100 nm. In detail, points 1 to 8 (stars 1 to 8) marked with a star sign (star sign) in FIG. 15 represent film thickness conditions for the buffer layer 15 and the light absorbing layer 16 which are subject to the simulation. The converted absorptance difference $A_1'-A_2'$ at the stars 1, 2, 3, and 4 is less than $-\Delta A'$ (=−0.00018), whereas the converted absorptance difference $A_1'-A_2'$ at the stars 5, 6, 7, and 8 is more than $-\Delta A'$. The stars 1, 2, 3, and 4 are located in the area on and inside the dotted line in FIG. 13.

Figure 16:
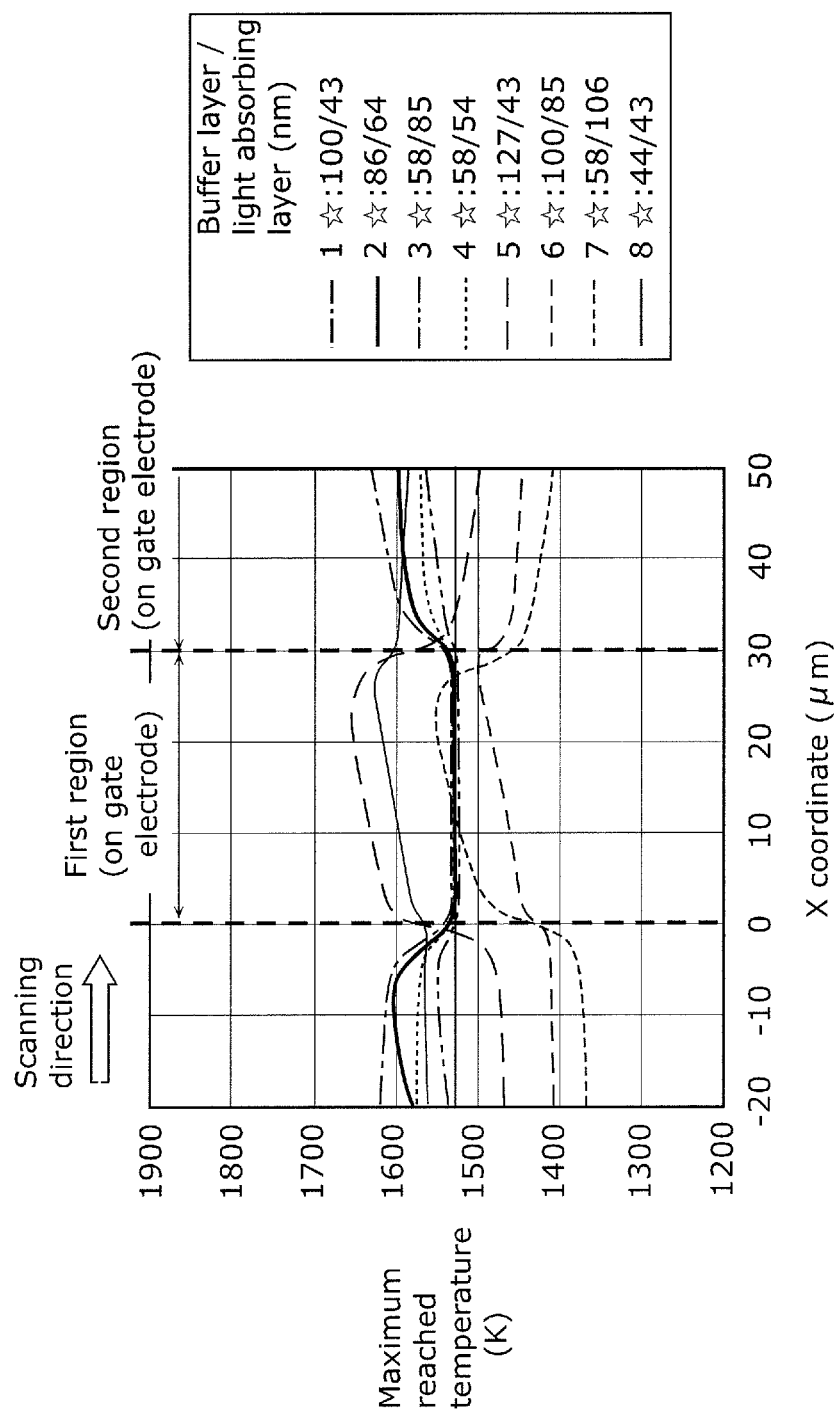
FIG. 16 is a diagram showing a simulation result of positional dependency of a maximum reached temperature of a surface of the amorphous silicon layer in a first region and a second region.

FIG. 16 is a diagram showing results of simulating the positional dependency of the maximum reached temperature of the surface of the amorphous silicon layer 14 in the first region and the second region. A horizontal axis represents a position coordinate, whereas a vertical axis represents a maximum reached temperature of the surface of the amorphous silicon layer 14. The amorphous silicon layer 14 receives heat from the light absorbing layer which absorbs the laser beam and is heated and the temperature of the amorphous silicon layer 14 increases. In detail, FIG. 16 shows a simulation result in the film thickness conditions at the stars 1 to 8 shown in FIG. 15. As shown in FIG. 16, in each of the film thickness conditions at the stars 1 to 4, a curve indicating the maximum reached temperature of the surface of the amorphous silicon layer 14 is flat in the first region located above the gate electrode 12. In each of the film thickness conditions at the stars 5 to 8, on the other hand, a curve indicating the maximum reached temperature of the surface of the amorphous silicon layer 14 is not flat in the first region located above the gate electrode 12.

These simulation results demonstrate that, when the film thickness of the amorphous silicon layer 14 and the film thickness of the gate insulating layer 13 satisfy such a converted absorptance difference $A_1'-A_2'$ between the amorphous silicon layer 14 in the first region and the amorphous silicon layer 14 in the second region that is in the area on and inside the contour represented by $-\Delta A'$, a uniform distribution of the reached temperature of the amorphous silicon layer 14 in the first region in the thin-film transistor 100 by heat generation can be attained. As a result, the amorphous silicon layer 14 in the first region in the thin-film transistor 100 can be sufficiently and uniformly crystallized to produce the crystalline silicon layer 17.

Figure 17A:
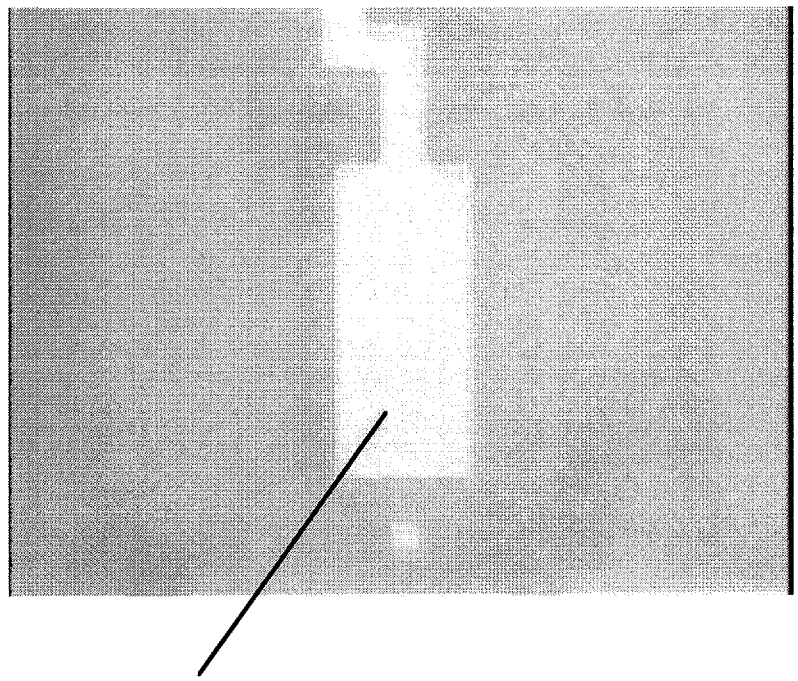
FIG. 17A is a diagram showing crystallinity of the crystalline silicon layer in the case of performing indirect heating crystallization method with laser on a structure according to the embodiment of the present disclosure using a laser beam in the red and near-infrared wavelength region.
Figure 17B:
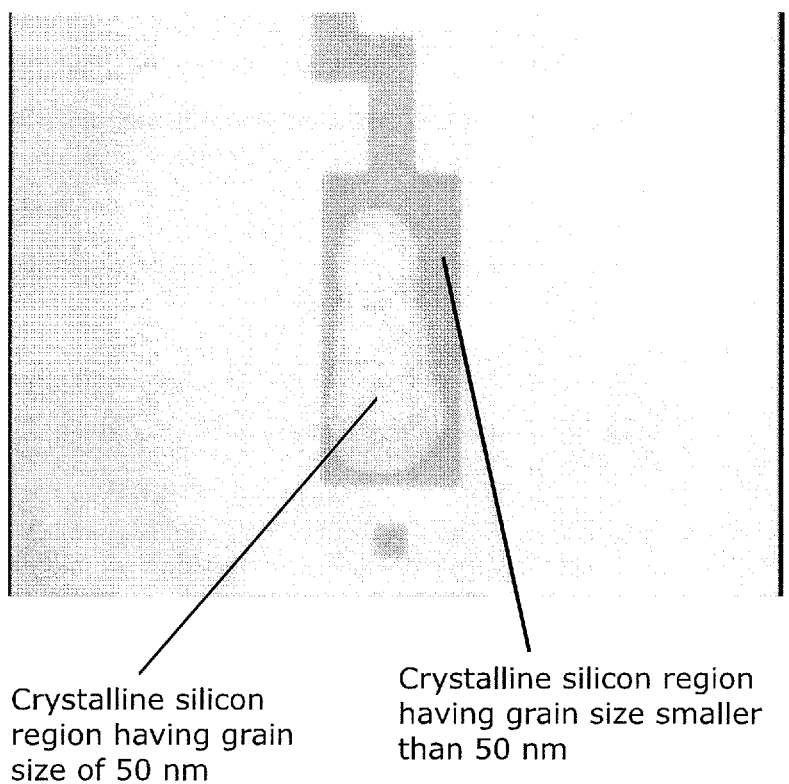
FIG. 17B is a diagram showing crystallinity of the crystalline silicon layer in the case of performing the indirect heating crystallization method with laser on the conventional structure using the laser beam in the red and near-infrared wavelength region.

This is summarized as follows. There is the indirect heating crystallization method with laser. In this method, first, the buffer layer and the light absorbing layer are formed above the amorphous silicon layer. Then, the light absorbing layer is heated by the laser irradiation on the light absorbing layer, and the amorphous silicon layer is indirectly crystallized through the buffer layer using the generated heat. Typically, in the case where the gate electrode is located below the amorphous silicon layer via the gate insulating layer in the indirect heating crystallization process with laser, insufficient and non-uniform heat generation of the amorphous silicon layer located above the gate electrode is caused by heat absorption and heat transmission by the gate electrode. This leads to a variation in crystallinity in the resulting crystalline silicon layer. By depositing the gate insulating layer, the amorphous silicon layer, the buffer layer, and the light absorbing layer in the aforementioned film thickness ranges, however, crystallization can be performed while suppressing the influence of heat absorption and heat transmission by the gate electrode in the indirect heating crystallization process with laser. Hence, the thin-film transistor (TFT) including the amorphous silicon layer and the gate insulating layer, which is the underlying layer of the amorphous silicon layer can exhibit uniform thin-film transistor characteristics. FIG. 17A is a diagram showing crystallinity of the crystalline silicon layer in the case of performing indirect heating crystallization method with laser on a conventional structure using a laser beam in the red and near-infrared wavelength region. FIG. 17B is a diagram showing crystallinity of the crystalline silicon layer in the case of performing the indirect heating crystallization method with laser on the structure according to the embodiment of the present disclosure using the laser beam in the red and near-infrared wavelength region for comparison. FIGS. 17A and 17B show an example where the energy density of the laser beam per unit time is 100 KW/cm², and a laser scan speed is 600 mm/s. With the conventional structure, there are a region crystallized with a grain size of 50 nm, and a region crystallized with a grain size less than 50 nm. That is, the crystallinity is not uniform. In contrast, with the structure according to the embodiment of the present disclosure, the region is uniformly crystallized with a grain size of 50 nm. The non-uniform crystallinity shown in FIG. 17B shows the non-uniform maximum reached temperature of the amorphous silicon layer on the gate electrode. When the indirect heating crystallization process with laser is performed on the structure according to the embodiment, the reached temperatures of the amorphous silicon layer on the gate electrode can be uniform in the plane, making the crystallinity of the crystalline silicon layer obtained as a result uniform as well.

Figure 18:
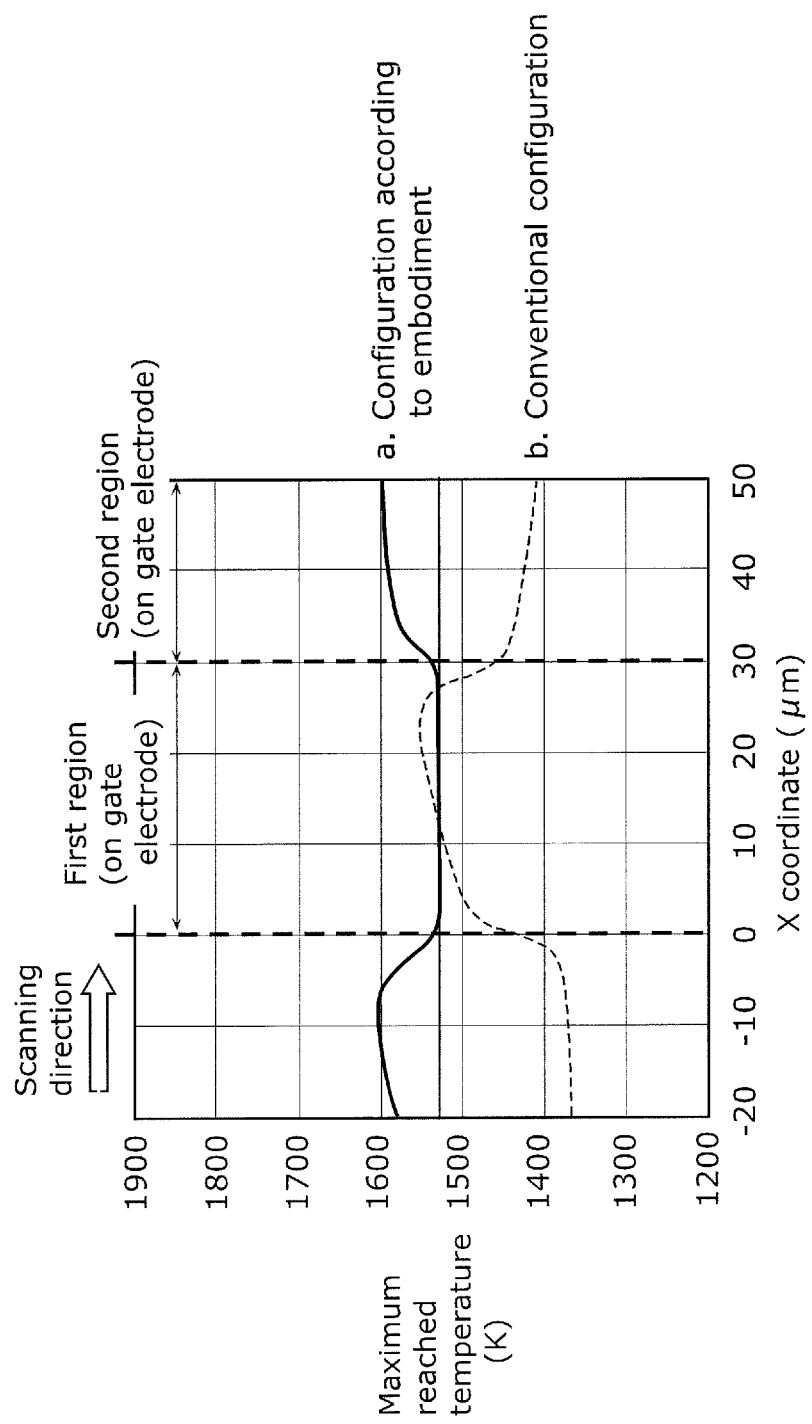
FIG. 18 is a diagram for describing advantageous effects of the embodiment of the present invention.

FIG. 18 is a diagram for describing advantageous effects of the embodiment of the present disclosure. In FIG. 18, the region other than the gate electrode 12, namely, the heat generation of the light absorbing layer 16 not located above the gate electrode 12 (i.e. in the second region), is utilized as a means of thermally saturating the gate electrode 12. In more detail, by setting the film thicknesses of the gate insulating layer 13, the amorphous silicon layer 14, the buffer layer 15, and the light absorbing layer 16 in the appropriate ranges, a difference in light interference effect depending on whether or not the gate electrode 12 is present is used so that (1) the light absorbing layer 16 not located above the gate electrode 12 has a higher light absorptance than the light absorbing layer 16 located above the gate electrode 12, that is, the light absorbing layer 16 not located above the gate electrode 12 (i.e. in the second region) generates more heat than the light absorbing layer 16 located above the gate electrode 12 (i.e. in the first region) when laser annealing is performed, and also (2) the amorphous silicon layer 14 located above the gate electrode 12 (i.e. in the first region) has a higher heat generation temperature than a melting point of silicon.

Owing to the advantageous effect (1), heat generated in the light absorbing layer 16 in the second region can be transmitted to and absorbed by the gate electrode 12 through the buffer layer 15, the amorphous silicon layer 14, and the gate insulating layer 13. This allows the gate electrode 12 to be thermally saturated before the laser beam irradiation on the light absorbing layer 16 located above the gate electrode 12 (i.e. in the first region). Hence, the influence of heat absorption and heat transmission by the gate electrode 12 on the crystallization of the amorphous silicon layer 14 located above the gate electrode 12 (i.e. in the first region) can be reduced. Moreover, owing to the advantageous effect (2), even in the case where the light absorbing layer 16 not located above the gate electrode 12 (i.e. in the second region) has an excessively higher light absorptance than the light absorbing layer 16 located above the gate electrode 12 (i.e. in the first region), that is, even in the case where the light absorbing layer 16 not located above the gate electrode 12 (i.e. in the second region) generates excessively more heat than the light absorbing layer 16 located above the gate electrode 12 (i.e. in the first region), the amorphous silicon layer 14 in both the light absorbing layer 16 located above the gate electrode 12 (i.e. in the first region) and the light absorbing layer 16 not located above the gate electrode 12 (i.e. in the second region) melt to become a molten silicon layer, as a result of which the heat conductivity of the amorphous silicon layer 14 increases to a substantially same level as a heat conductivity of metal typically used as the gate electrode 12.

Accordingly, heat generated from the molten silicon layer not located above the gate electrode 12 (i.e. in the second region) is mainly transmitted to the molten silicon layer located above the gate electrode 12 (i.e. in the first region), and thus kept from being excessively absorbed by the gate electrode 12 via the gate insulating layer 13. Therefore, the temperature distribution of the gate electrode 12 is kept from deterioration, and so the heat generation temperature distribution of the amorphous silicon layer 14 located above the gate electrode 12 (i.e. in the first region) is unaffected.

Thus, the combination of the advantageous effects (1) and (2) ensures a uniform heat generation temperature distribution of the amorphous silicon layer 14 located above the gate electrode 12 (i.e. in the first region). This leads to an advantageous effect of ensuring a uniform crystal structure in the crystalline silicon layer 17 produced by crystallization.

As described above, according to the present disclosure, it is possible to realize a thin-film transistor device manufacturing method, a thin-film transistor, and a display device using the thin-film transistor in which a crystalline silicon film of stable crystallinity can be formed using a laser beam in the red and near-infrared wavelength region. In detail, it is possible to realize a thin-film transistor device manufacturing method, a thin-film transistor, and a display device using the thin-film transistor in which a crystalline silicon layer of stable crystallinity can be formed using the laser beam in the red or near-infrared wavelength region by forming the gate insulating layer, the amorphous silicon layer, the buffer layer, and the light absorbing layer with respective film thicknesses that satisfy a predetermined condition, without a need for a particular change in thin-film transistor structure such as a gate electrode pattern shape.

Figure 19:
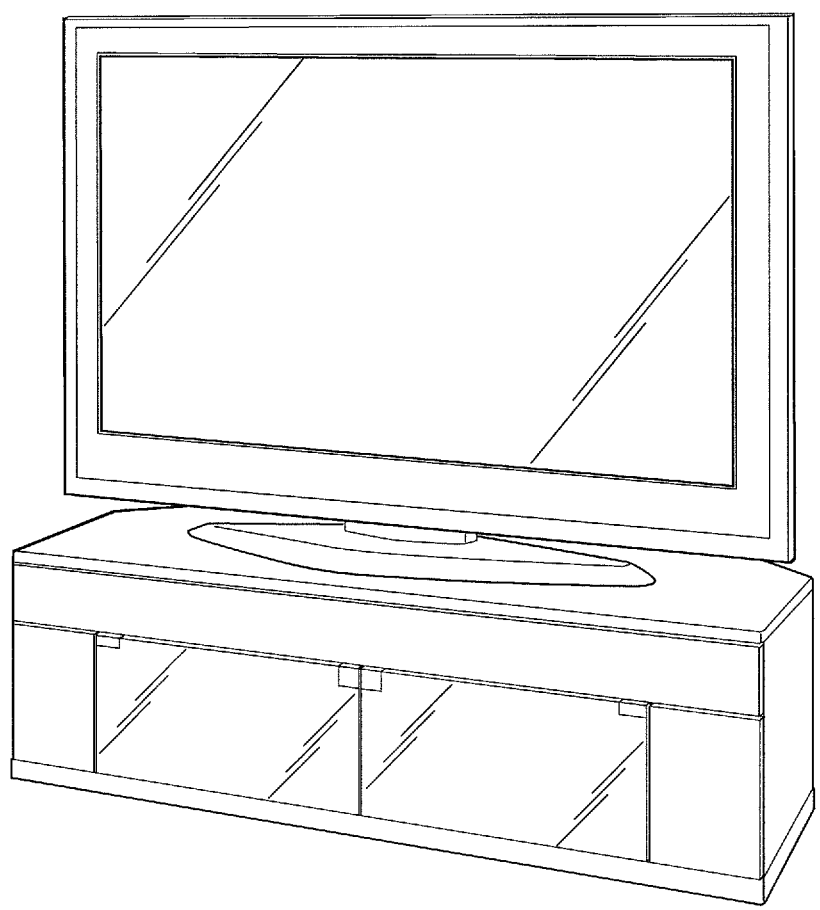
FIG. 19 is a diagram showing an example of the display apparatus that uses the thin-film transistor according to the present disclosure.

Moreover, a display device of high image quality with uniform TFT characteristics can be realized in the case where the thin-film transistor according to the present disclosure is used in a display device shown in FIG. 19. With such improvement in display quality, increased yields and reduced costs can be achieved, too.

The present disclosure achieves the advantageous effects merely by setting the aforementioned range of film thickness condition, without a need for a particular change in thin-film transistor structure such as a gate electrode pattern shape. Thus, the present disclosure is superior to the conventional art in that design flexibility is ensured even in the case of, for example, manufacturing a display device of a higher resolution.

Though the thin-film transistor device manufacturing method, the thin-film transistor, and the display device using the thin-film transistor according to the present disclosure have been described by way of the embodiment, the present disclosure is not limited to the embodiment. Modifications obtained by applying various changes conceivable by those skilled in the art to the embodiment and any combinations of components in different embodiments are also included in the present disclosure without departing from the scope of the present disclosure.

INDUSTRIAL APPLICABILITY

The present disclosure is applicable to a thin-film transistor device manufacturing method, a thin-film transistor, and a display device including a liquid crystal panel or an EL panel such as an organic EL panel using the thin-film transistor. The present disclosure is particularly applicable to, for example, manufacturing of a display device including a liquid crystal panel or an EL panel such as an organic EL panel of high image quality with uniform TFT characteristics because, in the case where a gate electrode is located below an amorphous silicon layer via a gate insulating film in a laser crystallization process, stable crystallization can be performed while suppressing an influence of heat absorption and heat transmission by the gate electrode.

The invention claimed is:
1. A thin-film transistor device manufacturing method comprising:
 preparing a substrate;
 forming a plurality of gate electrodes above the substrate;
 forming a gate insulating layer on the plurality of gate electrodes;

forming an amorphous silicon layer on the gate insulating layer;

forming a buffer layer on the amorphous silicon layer;

forming a light absorbing layer on the buffer layer;

forming a crystalline silicon layer by indirectly crystallizing the amorphous silicon layer with heat generated by heating the light absorbing layer using a laser beam emitted from a predetermined laser and having a wavelength greater than or equal to 600 nm while moving the predetermined laser in a given direction relative to the substrate; and forming a source electrode and a drain electrode on the crystalline silicon layer in a region that corresponds to each of the plurality of gate electrodes, wherein a film thickness of the gate insulating layer, a film thickness of the amorphous silicon layer, a film thickness of the buffer layer, and a film thickness of the light absorbing layer satisfy X and Y that are in a range defined by Expressions 1 to 4:

$Y \leq -1.06X - 0.22\Delta A' + 1.07;$ Expression 1:

$Y \geq 1.29X + 1.61*\Delta A' + 1.44;$ Expression 2:

$Y \geq 1.06X + 0.33\Delta A' + 0.89;$ and Expression 3:

$Y \leq 1.29X + -0.97*\Delta A' - 0.95,$ Expression 4:

where X is a value obtained by dividing an optical film thickness of the light absorbing layer by the wavelength of the laser beam, the optical film thickness of the light absorbing layer being a result of multiplying the film thickness of the light absorbing layer by a refractive index of the light absorbing layer, Y is a value obtained by dividing a sum of an optical film thickness of the buffer layer, an optical thickness of the amorphous silicon layer, and an optical film thickness of the gate insulating layer by the wavelength of the laser beam, the optical film thickness of the buffer layer being a result of multiplying a thickness of the buffer layer by a refractive index of the buffer layer, the optical film thickness of the amorphous silicon layer being a result of multiplying a film thickness of the amorphous silicon layer by the refractive index of the amorphous silicon layer, and the optical film thickness of the gate insulating layer being a result of multiplying a film thickness of the gate insulating layer by a refractive index of the gate insulating layer, and $\Delta A'$ is a value calculated according to an expression $(AG/dG) \times (\rho \times c)/(\rho G \times cG)$, where $\rho$ and $c$ are a density and a specific heat of the light absorbing layer, respectively, $dG$, $\rho G$, and $cG$ are a film thickness, a density, and a specific heat of the gate electrode, respectively, and AG is a maximum absorptance of the gate electrode when the light absorbing layer located above the gate electrode and the light absorbing layer not located above the gate electrode have an equal light absorptance for the laser beam.

2. The thin-film transistor device manufacturing method according to claim 1, wherein the light absorbing layer is translucent to a predetermined wavelength range of the laser beam, where an extinction coefficient k<1.

3. The thin-film transistor device manufacturing method according to claim 1, further comprising removing at least the light absorbing layer after forming the crystalline silicon layer and before forming the source electrode and the drain electrode.

4. The thin-film transistor device manufacturing method according to claim 1, further comprising removing the buffer layer and the light absorbing layer after forming the crystalline silicon layer and before forming the source electrode and the drain electrode.

5. The thin-film transistor device manufacturing method according to claim 1, wherein, when forming the light absorbing layer, the predetermined laser emits the laser beam in an oscillation mode that is a continuous wave mode or a quasi-continuous wave mode.

6. The thin-film transistor device manufacturing method according to claim 1, wherein the predetermined laser is included in a solid-state laser device.

7. The thin-film transistor device manufacturing method according to claim 1, wherein the predetermined laser is included in a laser device that uses a semiconductor laser element.

8. The thin-film transistor device manufacturing method according to claim 1, wherein, when forming the light absorbing layer, a variation in irradiation energy density of the laser beam on the amorphous silicon layer is approximately less than 5%.

9. The thin-film transistor device manufacturing method according to claim 1, wherein the wavelength of the predetermined laser has a wavelength from 600 nm to 2000 nm.

10. The thin-film transistor device manufacturing method according to claim 1, wherein the gate electrode forming includes:

forming an undercoat layer made of silicon oxide on the substrate; and forming the plurality of gate electrodes on the undercoat layer.

\* \* \* \* \*